(12) United States Patent
Matsueda et al.

(10) Patent No.: US 10,475,873 B2
(45) Date of Patent: Nov. 12, 2019

(54) DISPLAY APPARATUS

(71) Applicant: Tianma Japan, Ltd., Kanagawa (JP)

(72) Inventors: Yojiro Matsueda, Kanagawa (JP); Kenichi Takatori, Kanagawa (JP); Yoshihiro Nonaka, Kanagawa (JP)

(73) Assignee: TIANMA MICROELECTRONICS CO., LTD., Shenzhen (CN)

( * ) Notice: Subject to any disclaimer, the term of this patent is extended or adjusted under 35 U.S.C. 154(b) by 268 days.

(21) Appl. No.: 15/667,713

(22) Filed: Aug. 3, 2017

(65) Prior Publication Data

US 2018/0040683 A1     Feb. 8, 2018

(30) Foreign Application Priority Data

Aug. 5, 2016   (JP) .................................. 2016-155049

(51) Int. Cl.

| G06F 3/038 | (2013.01) |
| G09G 5/00  | (2006.01) |
| H01L 27/32 | (2006.01) |
| H01L 51/52 | (2006.01) |
| H01L 27/12 | (2006.01) |
| H01L 51/56 | (2006.01) |

(52) U.S. Cl.
CPC ...... H01L 27/3276 (2013.01); H01L 51/5237 (2013.01); *H01L 27/124* (2013.01); *H01L 27/1218* (2013.01); *H01L 51/5203* (2013.01); *H01L 51/56* (2013.01)

(58) Field of Classification Search
CPC ............... H01L 27/1218; H01L 27/124; H01L 27/3276; H01L 51/5203; H01L 51/5237; H01L 51/56
See application file for complete search history.

(56) References Cited

U.S. PATENT DOCUMENTS

| 2008/0266210 A1* | 10/2008 | Nonaka ..................... G09G 3/20 345/55 |
| 2009/0102758 A1* | 4/2009 | Anzai ................... G09G 3/3225 345/76 |

(Continued)

FOREIGN PATENT DOCUMENTS

| JP | 2008-292995 | 12/2008 |
| JP | 2010-122461 | 6/2010 |

(Continued)

*Primary Examiner* — Insa Sadio
(74) *Attorney, Agent, or Firm* — Young & Thompson

(57) ABSTRACT

A display apparatus includes: pixels in a non-rectangular display region; a scan circuit outputting a scan signal; a data signal circuit outputting a data signal; a first wiring portion with a first signal to control the scan circuit; a second wiring portion with a second signal to control the data signal circuit; a first auxiliary wiring portion connecting the first wiring portion and the scan circuit; and a second auxiliary wiring portion connecting the second wiring portion and the data signal circuit. The scan circuit and the data signal circuit are outside the display region, the first wiring portion and the second wiring portion are disposed outside the first region, the first auxiliary wiring portion lies approximately orthogonal to an extension direction of the first wiring portion, and the second auxiliary wiring portion is disposed along a direction approximately orthogonal to an extension direction of the second wiring portion.

15 Claims, 20 Drawing Sheets

(56) References Cited

U.S. PATENT DOCUMENTS

Figure 1:
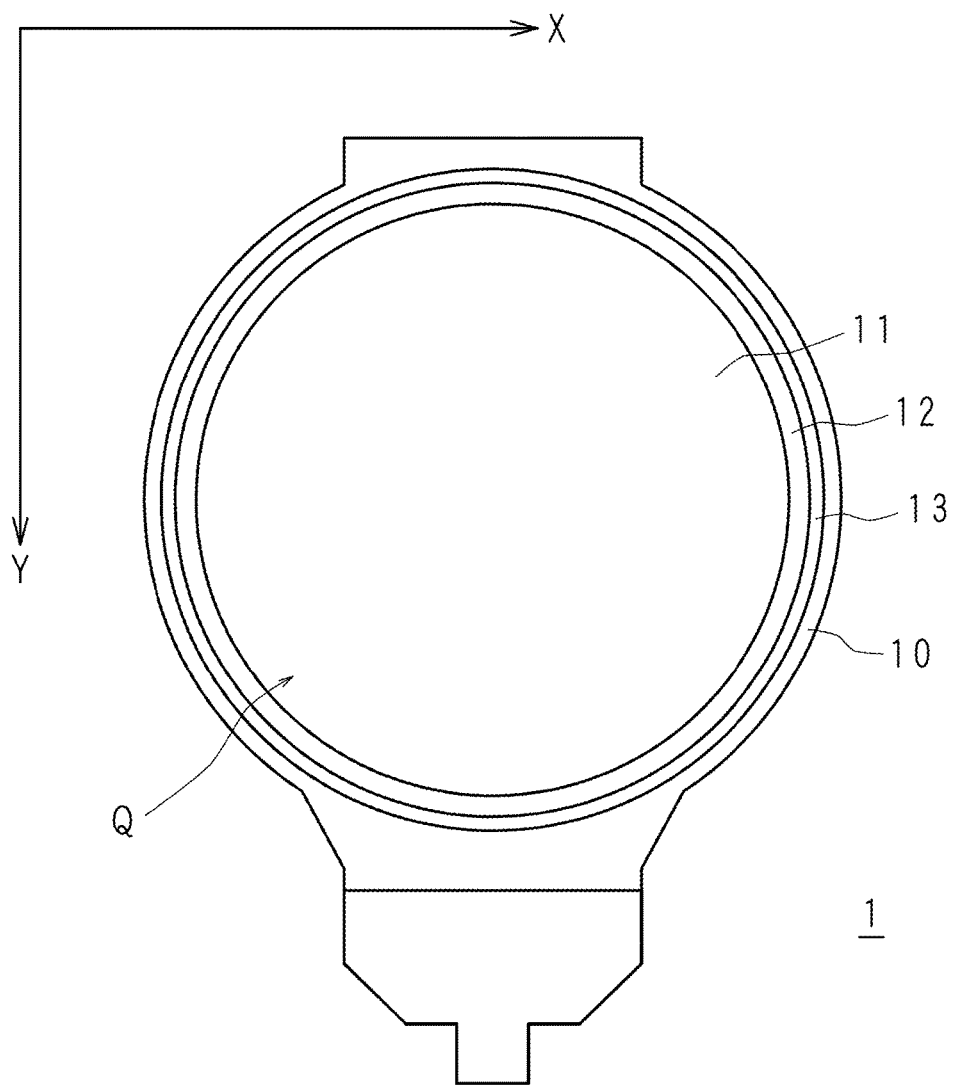

| | | | |
|---|---|---|---|
| 2010/0177069 A1 | 7/2010 | Park et al. | |
| 2010/0188375 A1 | 7/2010 | Lee et al. | |
| 2010/0289994 A1* | 11/2010 | Nonaka | G02F 1/133514 349/108 |
| 2011/0050741 A1 | 3/2011 | Jeong | |
| 2012/0139820 A1 | 6/2012 | Senda et al. | |

FOREIGN PATENT DOCUMENTS

| | | |
|---|---|---|
| JP | 2010-164937 | 7/2010 |
| JP | 5308990 | 7/2013 |
| JP | 5371519 | 9/2013 |
| JP | 5832757 | 11/2015 |

* cited by examiner

F I G. 4
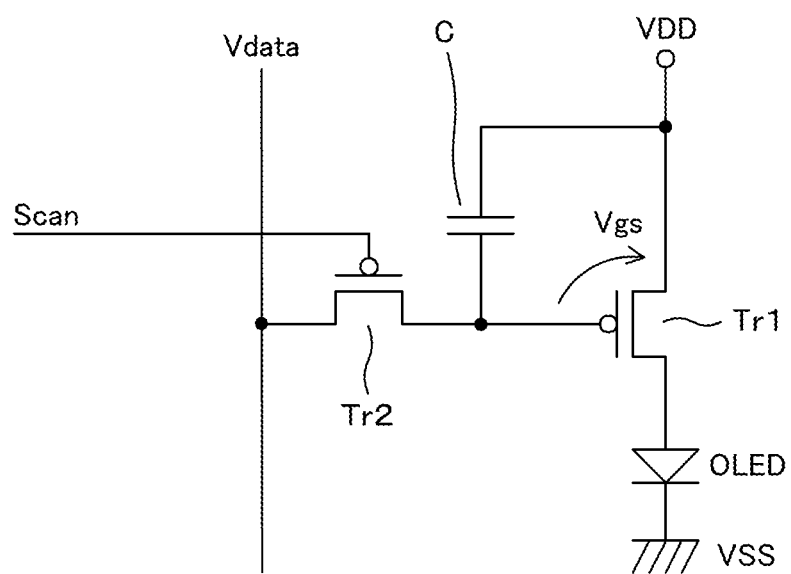

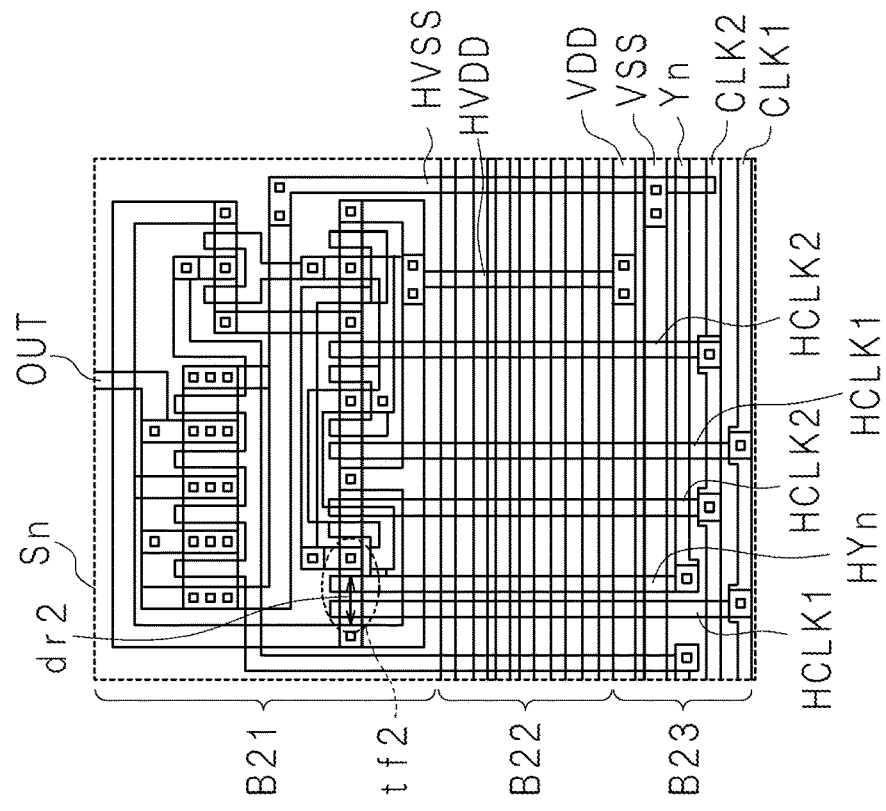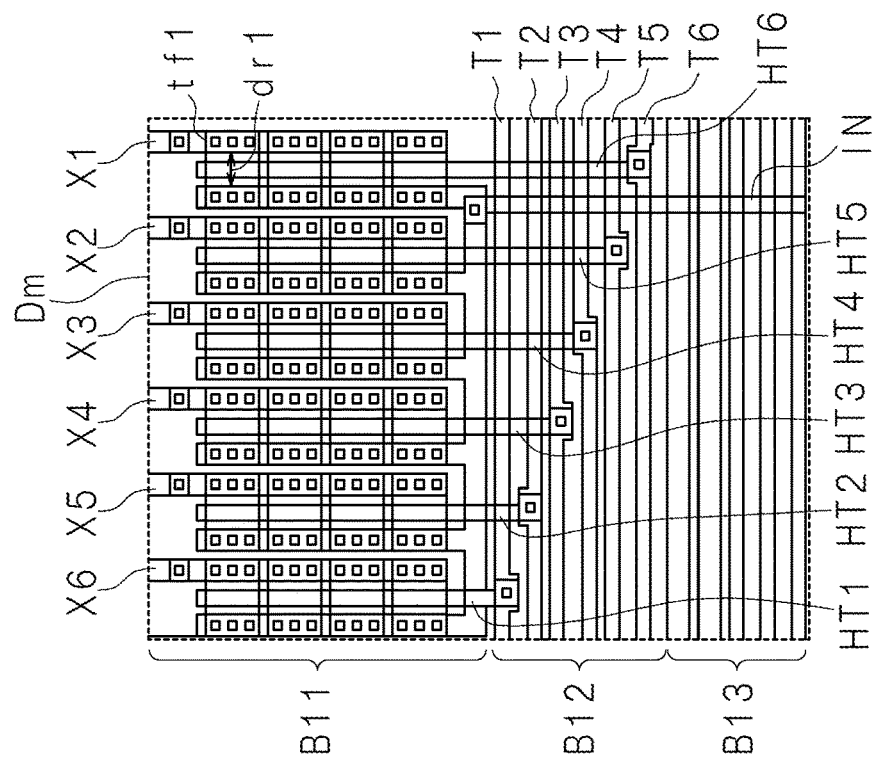

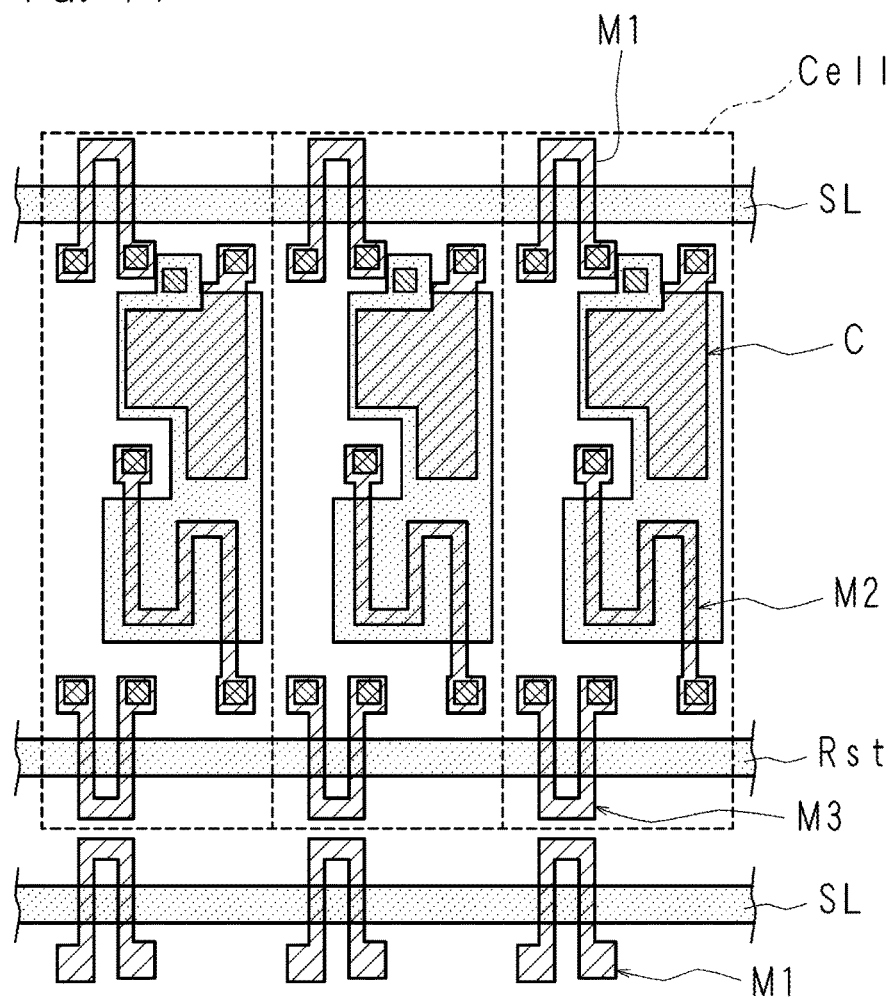
F I G. 17

DISPLAY APPARATUS

CROSS-REFERENCE TO RELATED APPLICATIONS

This non-provisional application claims priority under 35 U.S.C. § 119(a) on Patent Application No. 2016-155049 filed in Japan on Aug. 5, 2016, the entire contents of which are hereby incorporated by reference.

TECHNICAL FIELD

The present disclosure relates to a display apparatus.

BACKGROUND

In recent years, a display apparatus having a non-rectangular display region such as a circular display region has been commercialized (Japanese Patent Laid-Open Publication No. 2008-292995). In major display apparatuses having the non-rectangular display region, a partial driver which uses a demultiplexer (DEMUX) is incorporated. In the partial driver-incorporated display apparatus, a DEMUX circuit and a scan driver circuit are disposed in an outer circumference of a display panel that forms the display apparatus.

In the display apparatus having the non-rectangular display region, the DEMUX circuit and the scan driver circuit are sometimes disposed in a partial region of the outer circumference in a concentrated manner. The partial region is a region of the outer circumference of the display region in which a driver IC is disposed. As a result, a bezel width corresponding to the region widens. On the other hand, it is desirable to narrow the bezel width so that the display region is relatively large.

SUMMARY

A display apparatus according to one aspect of the present disclosure comprises a plurality of pixels arrayed in a non-rectangular display region along a first direction and a second direction; a scan circuit that outputs a scan signal via a scan line to a first pixel group extending along the first direction; a data signal circuit that outputs a data signal corresponding to an emission luminance of a pixel to which the scan signal is input via a data line to a second pixel group extending along the second direction; a first wiring portion to which a first signal to control the scan circuit is supplied; a second wiring portion to which a second signal to control the data signal circuit is supplied; a first auxiliary wiring portion that connects the first wiring portion and the scan circuit to each other; and a second auxiliary wiring portion that connects the second wiring portion and the data signal circuit to each other, wherein the scan circuit and the data signal circuit are disposed in a first region located outside the display region, the first wiring portion and the second wiring portion are disposed in a second region located outside the first region, the first auxiliary wiring portion is disposed along a direction approximately orthogonal to an extension direction of the first wiring portion, and the second auxiliary wiring portion is disposed along a direction approximately orthogonal to an extension direction of the second wiring portion.

It is to be understood that both the foregoing general description and the following detailed description are exemplary and explanatory and are not restrictive of the invention.

The above and further objects and features will more fully be apparent from the following detailed description with accompanying drawings.

BRIEF DESCRIPTION OF SEVERAL VIEWS OF DRAWINGS

Figure 2:
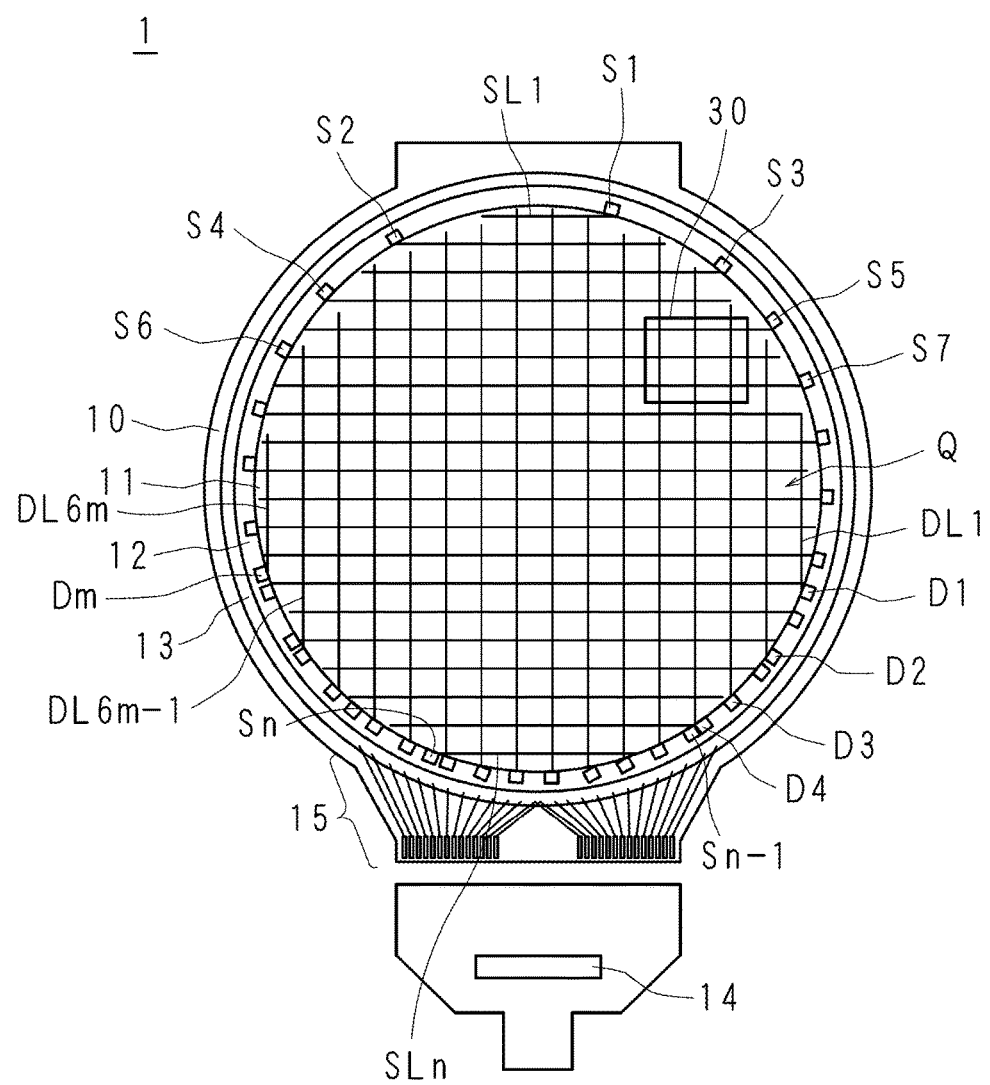
Figure 3:
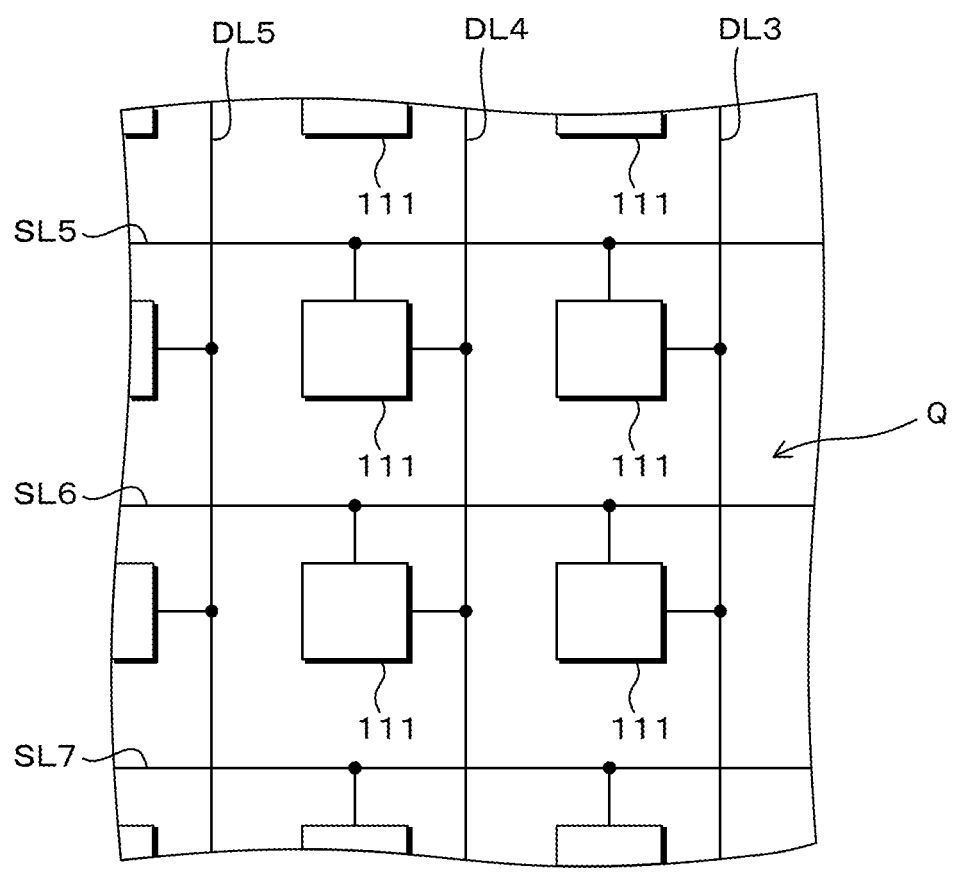
Figure 5A:
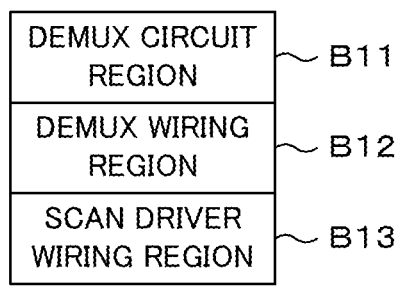
Figure 5B:
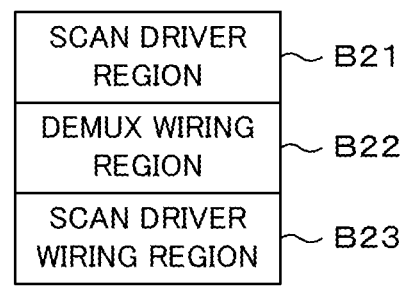
Figure 7:
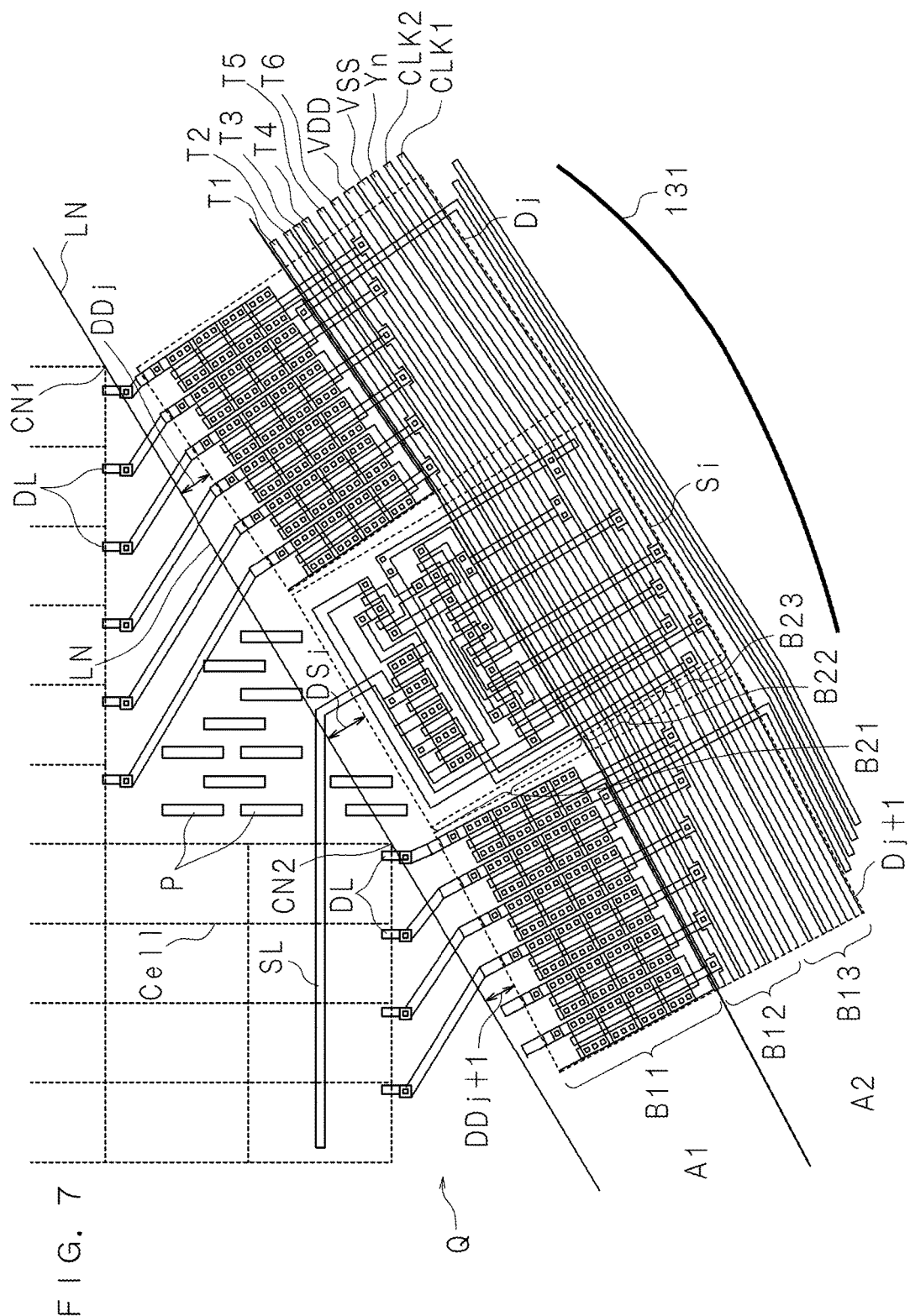
Figure 8:
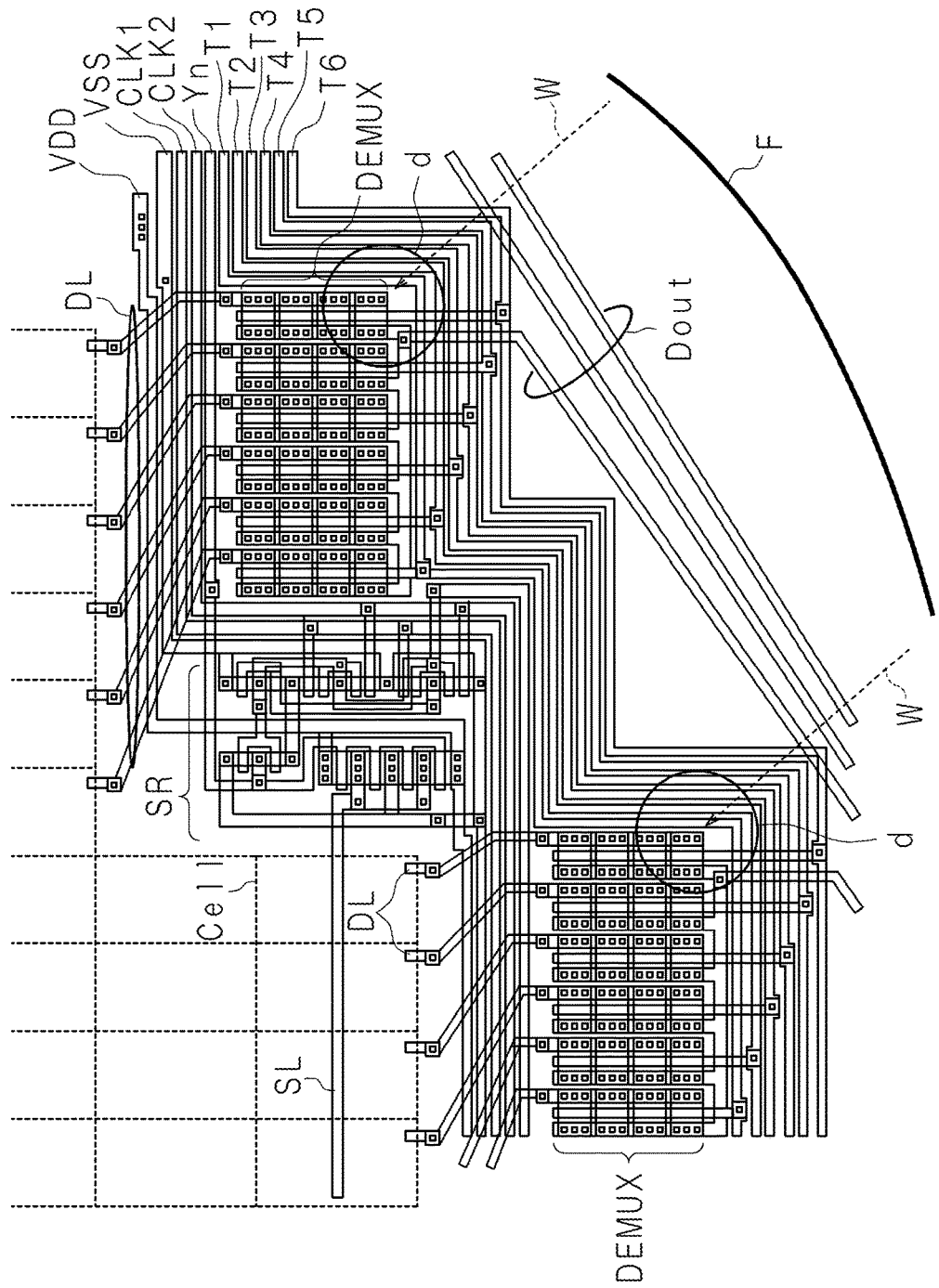
Figure 9:
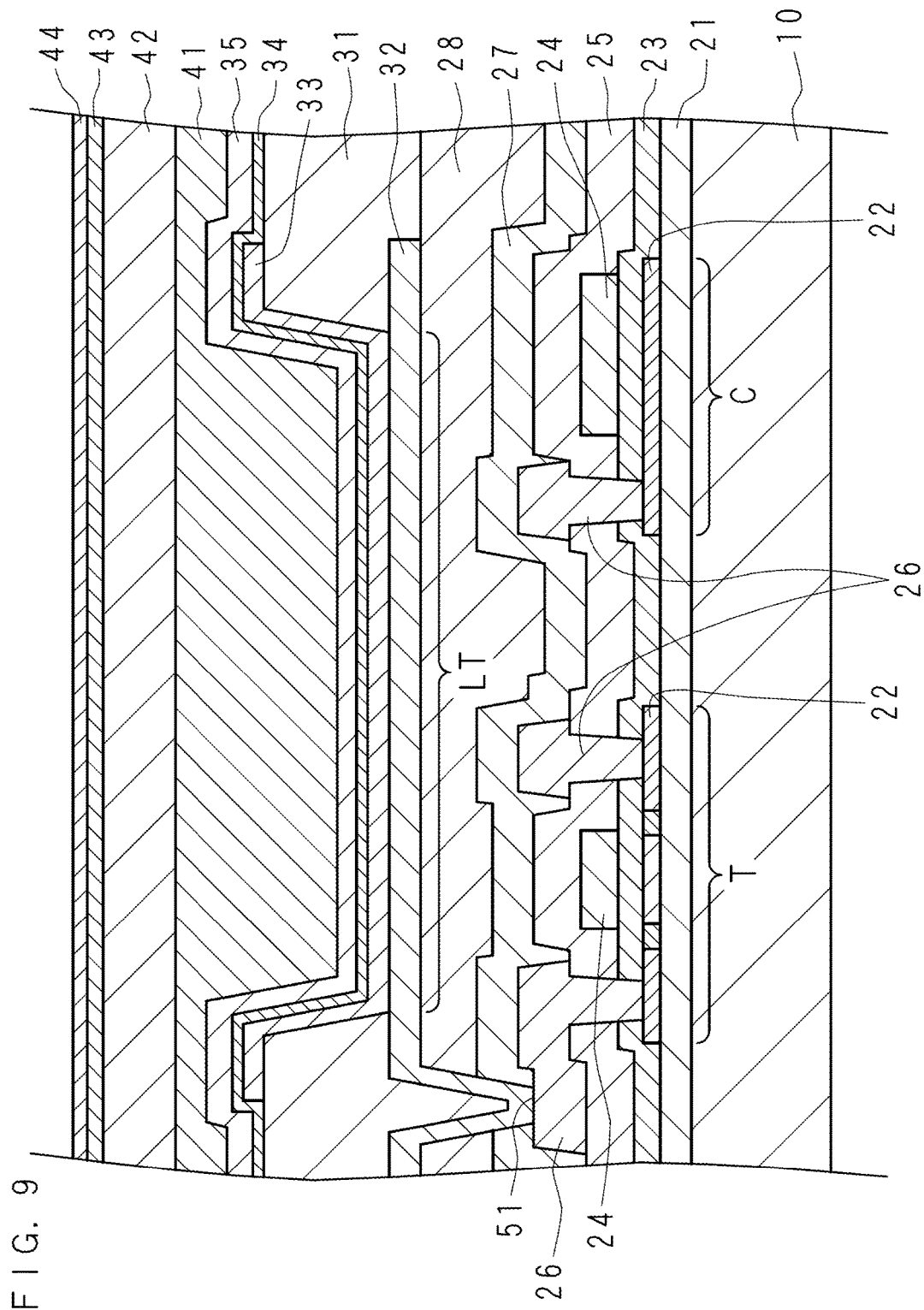
Figure 10:
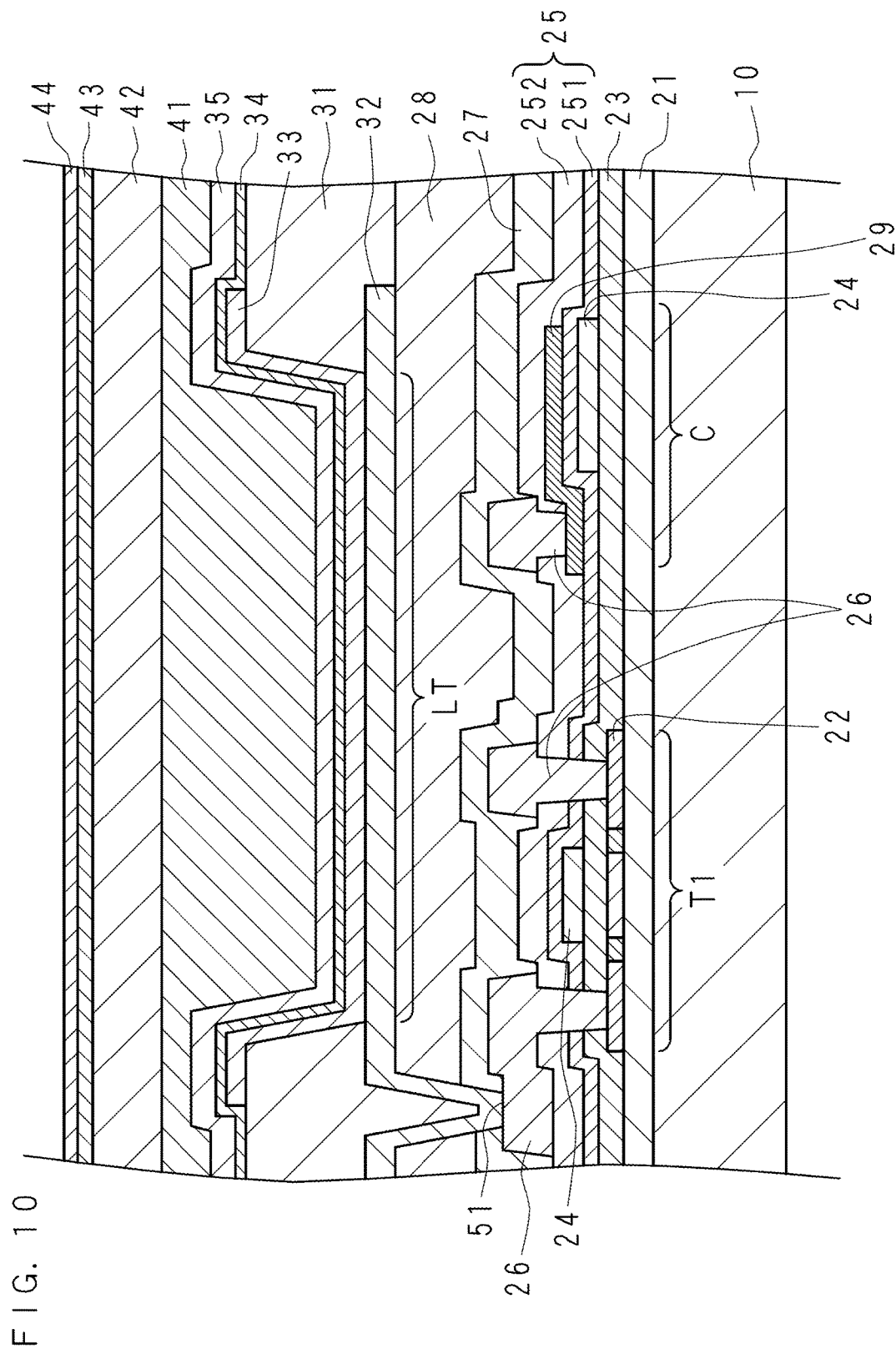
Figure 11:
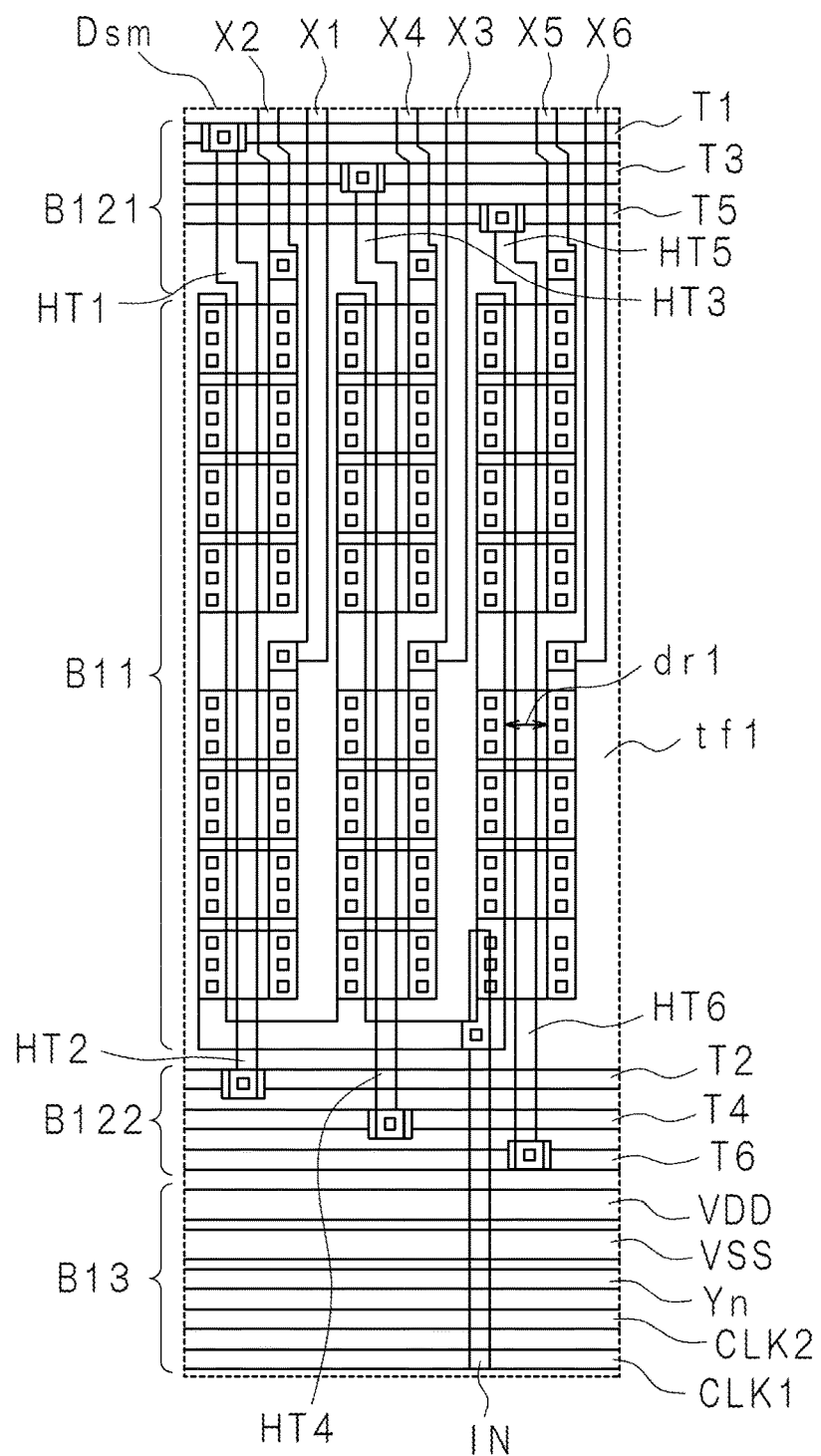
Figure 12:
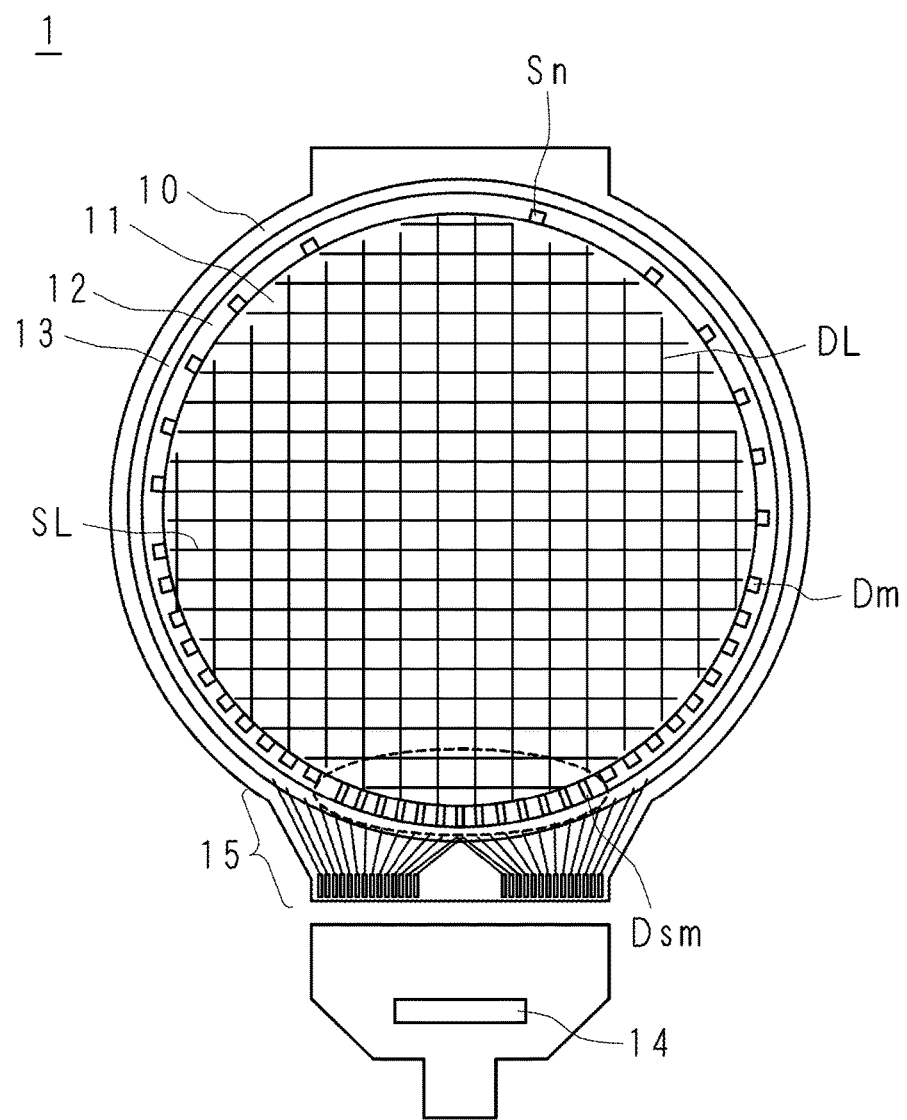
Figure 13:
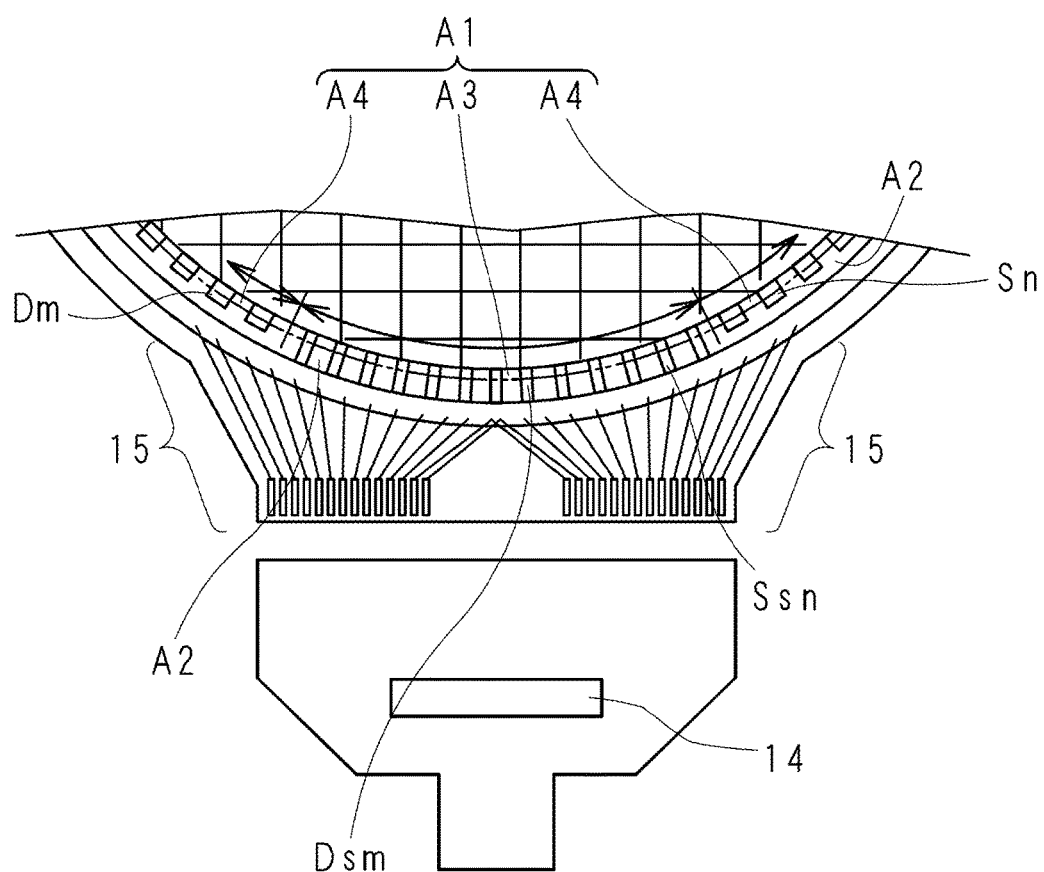
Figure 14:
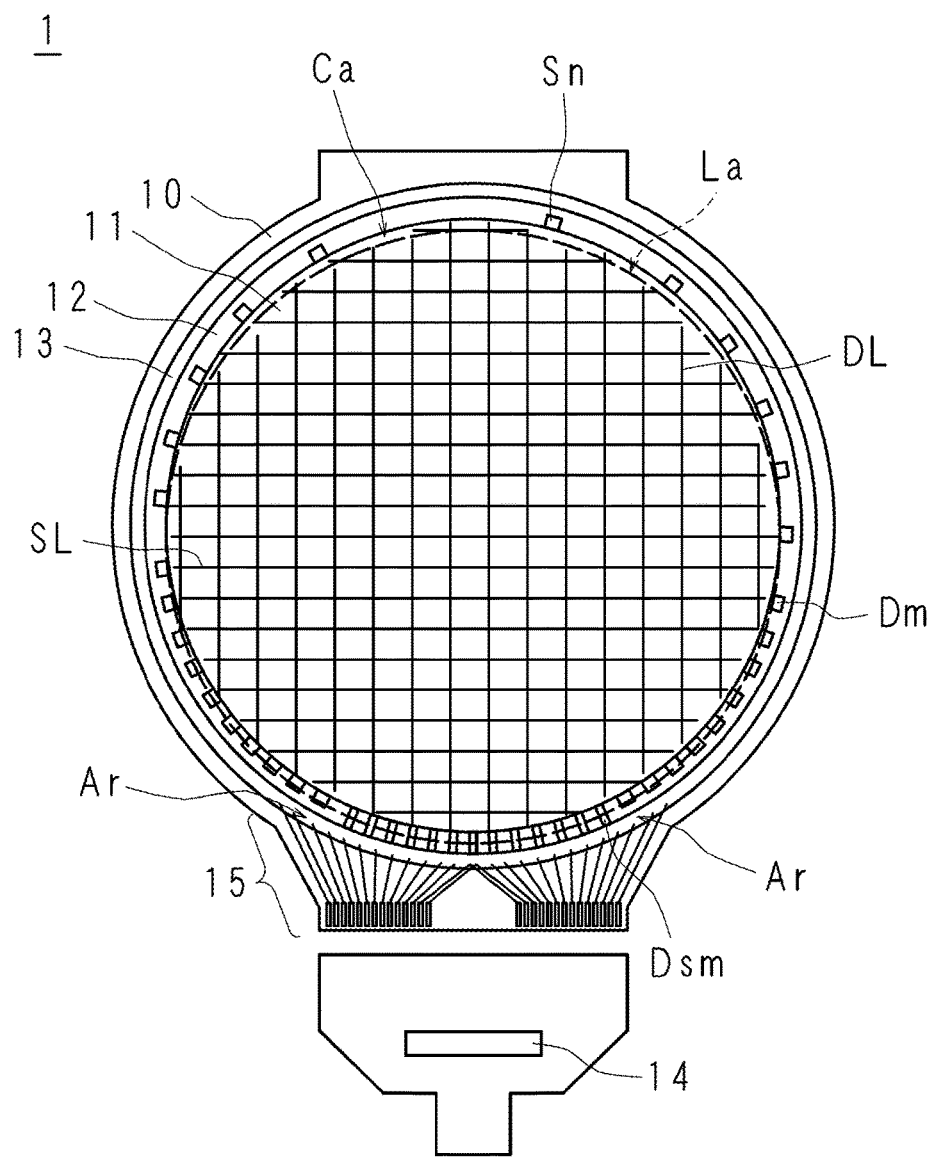
Figure 15:
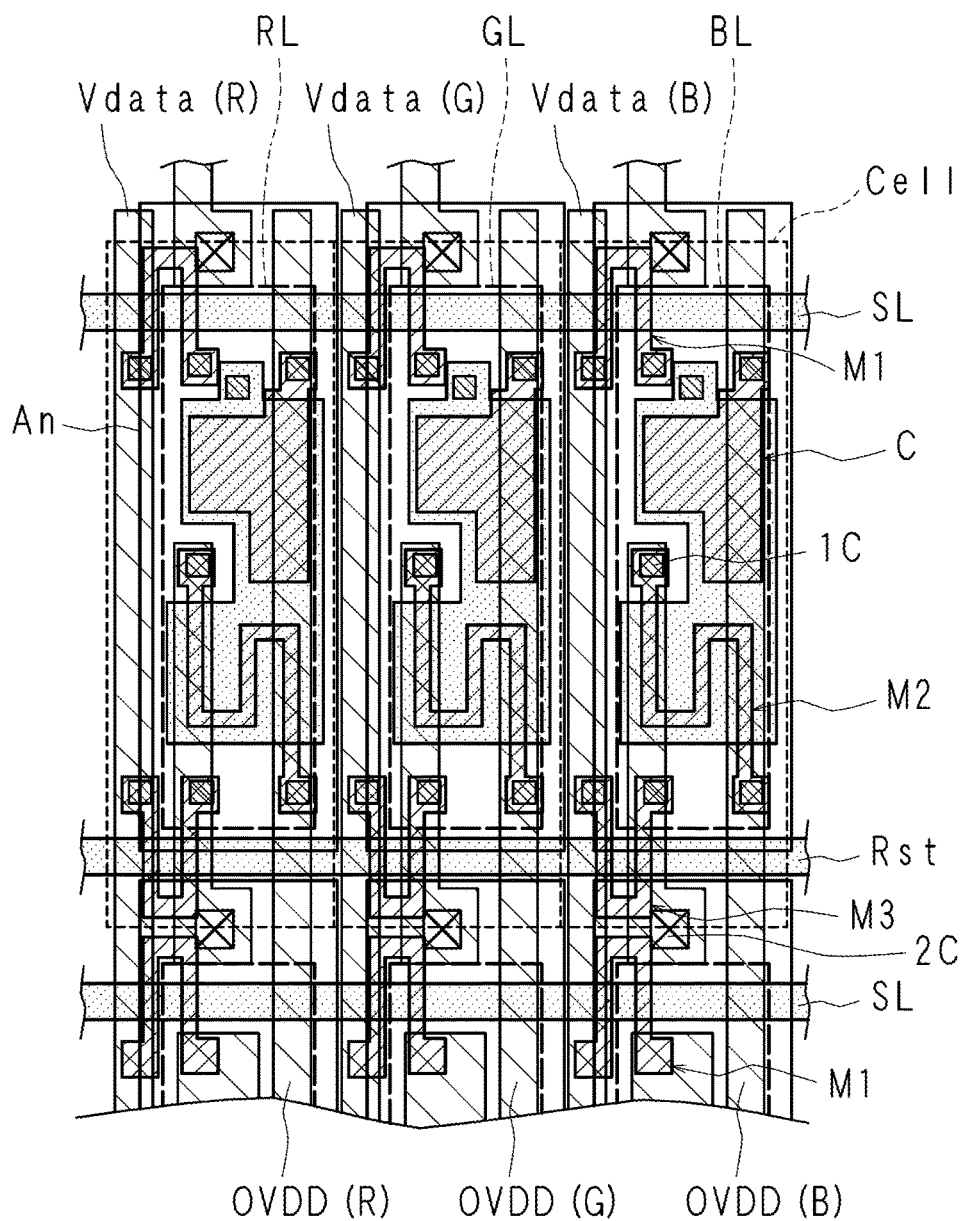
Figure 16:
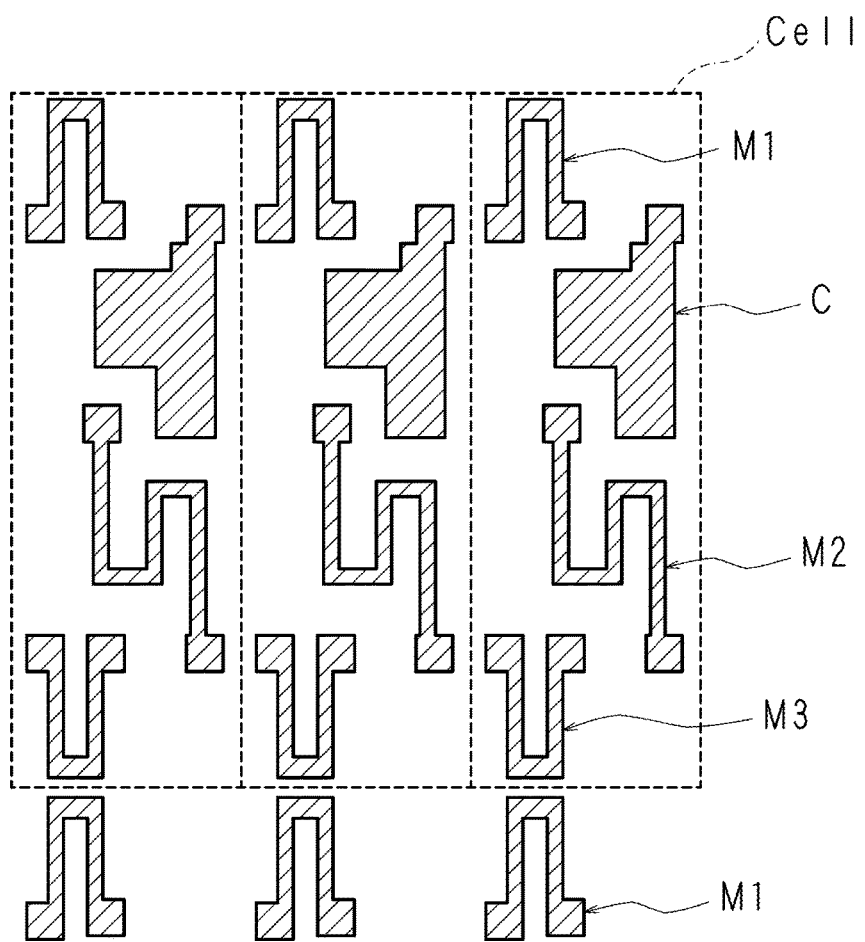
Figure 18:
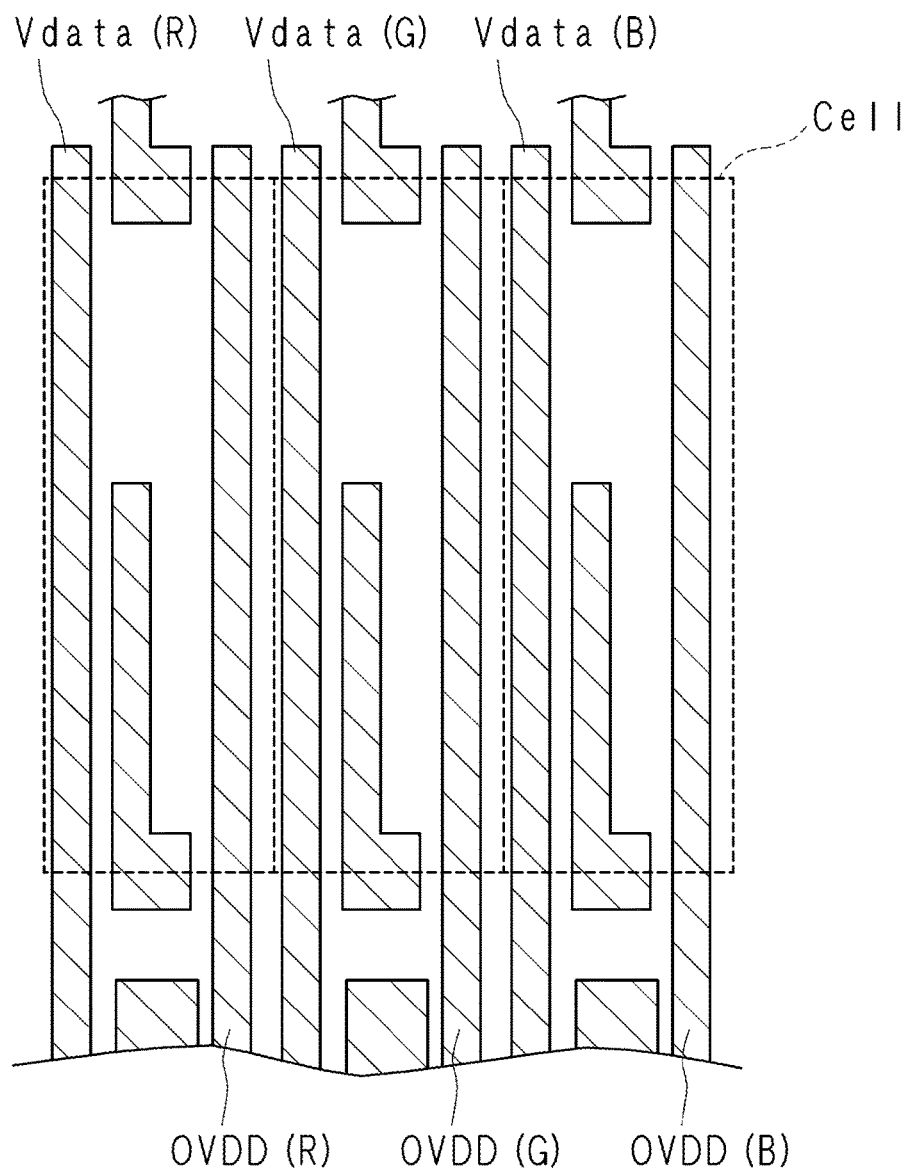
Figure 19:
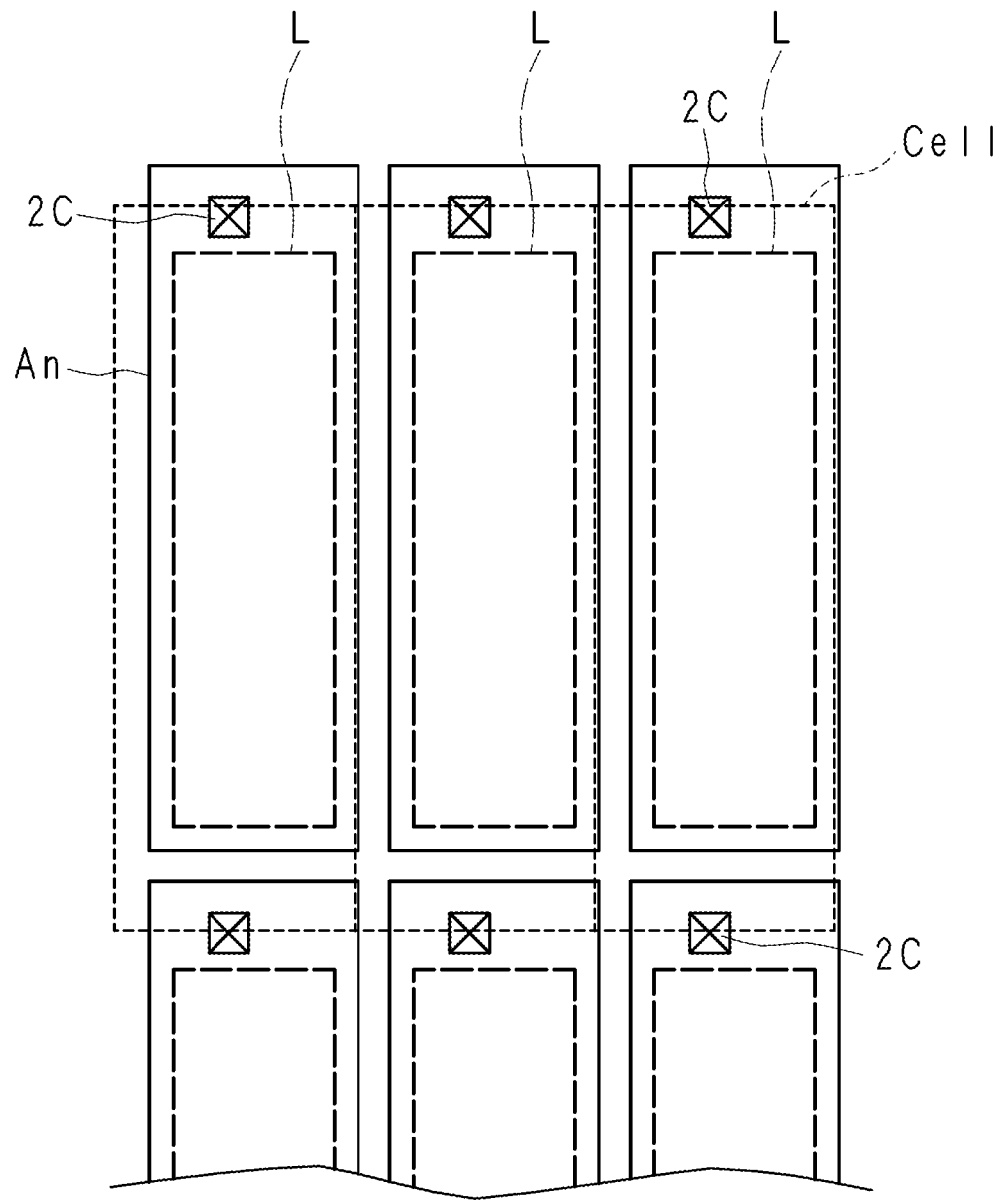
Figure 20:
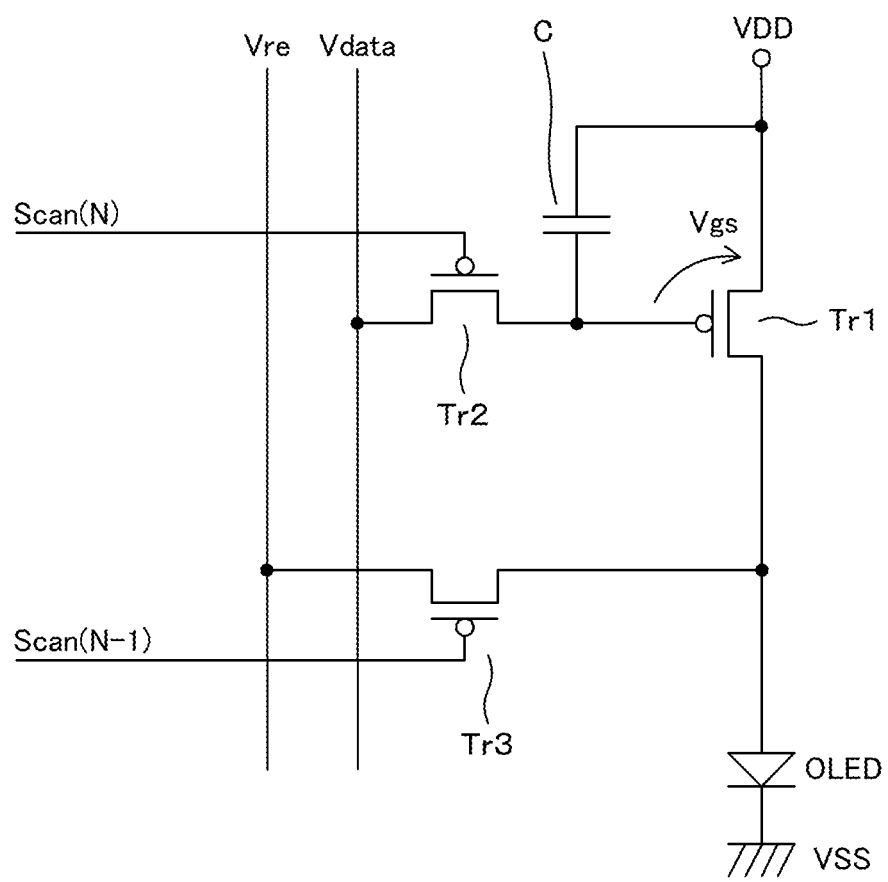

FIG. 1 is a plan view illustrating an appearance of a display apparatus.
FIG. 2 is a plan view illustrating a configuration of the display apparatus.
FIG. 3 is a partial enlarged view illustrating the configuration of the display apparatus.
FIG. 4 is a circuit diagram illustrating an example of a pixel circuit included in a pixel.
FIG. 5A is a block diagram illustrating a configuration example of a data driver block.
FIG. 5B is a block diagram illustrating a configuration example of a scan driver block.
FIG. 6A is a plan view illustrating the configuration example of the data driver block.
FIG. 6B is a plan view illustrating the configuration example of the scan driver block.
FIG. 7 is a plan view illustrating an arrangement example of the data driver block and the scan driver block.
FIG. 8 is a plan view illustrating an arrangement example of a scan driver block and a data driver block according to a related art.
FIG. 9 is an example of a cross-sectional view of a display section.
FIG. 10 is an example of a cross-sectional view of a display section.
FIG. 11 is a plan view illustrating a configuration example of a data driver block.
FIG. 12 is a plan view illustrating an arrangement example of the data driver block and a scan driver block.
FIG. 13 is a partial enlarged view of FIG. 12.
FIG. 14 is a plan view illustrating a configuration of a display apparatus.
FIG. 15 is a plan view illustrating a configuration example of a pixel circuit.
FIG. 16 is a plan view illustrating a pattern example of a layer.
FIG. 17 is a plan view illustrating a pattern example of a layer.
FIG. 18 is a plan view illustrating a pattern example of a layer.
FIG. 19 is a plan view illustrating a pattern example of a layer.
FIG. 20 is a circuit diagram illustrating another example of a pixel circuit included in a pixel.

DETAILED DESCRIPTION

Embodiment 1

Hereinafter, embodiments will be described in detail with reference to the drawings. Ordinal numbers such as "first" and "second" in the specification and the claims are used to clarify the relation between components and to prevent confusion between components. Therefore, these ordinal numbers do not limit the number of components.

A non-rectangular shape indicates a shape other than a rectangular shape (quadrangle). The non-rectangular shape includes a triangle and a polygon having a number of angles equal to or larger than a number of angles of a pentagon. The non-rectangular shape also includes a circular shape, an elliptical shape, a star shape, a heart shape, and a wedge shape.

In the following description, two directions being approximately orthogonal to each other means that an angle between two vectors indicating two directions is between 60° and 120°, for example. Two directions being approximately parallel to each other means that an angle between two vectors indicating two directions is between 0° and 30°.

In the following description, a display apparatus having a circular display region as an example of a non-rectangular display region will be described. Particularly, an organic light emitting diode (OLED) display apparatus which uses an OLED as a light emitting device will be described.

FIG. 1 is a plan view illustrating an appearance of a display apparatus 1. The display apparatus 1 comprises a substrate 10, a display section 11, and a driver IC 14. The substrate 10 is a transparent substrate such as a glass substrate. The display section 11 is formed on the substrate 10. A thin film transistor (TFT) circuit arrangement region 12 is provided along an outer circumferential edge of the display section 11. A glass frit seal portion 13 is provided along an outer circumferential edge of the TFT circuit arrangement region 12.

In the following description, two directions of the display apparatus 1 will be defined. As illustrated in FIG. 1, two orthogonal axes in a plan parallel to a display region of the display section 11 are defined. The two axes are an X-axis and a Y-axis. An X-axis direction is a first direction. A Y-axis direction is a second direction.

FIG. 2 is a plan view illustrating a configuration of the display apparatus 1. FIG. 3 is a partial enlarged view illustrating a configuration of the display apparatus 1. FIG. 3 illustrates a region 30 in FIG. 2 at an enlarged scale. The display apparatus 1 comprises scan lines extending in the first direction and data lines extending in the second direction. The n scan lines SL1 to SLn are disposed. The 6m data lines DL1 to DL6m are disposed.

The display apparatus 1 comprises n scan driver blocks S1 to Sn. The scan driver blocks S1 to Sn are disposed in the TFT circuit arrangement region 12. The scan driver blocks S1 to Sn each supply a scan signal to the scan lines SL1 to SLn. In the following description, when describing functions and operations common to the scan driver blocks S1 to Sn, the scan driver blocks S1 to Sn are collectively referred to as the scan driver block Sn.

The display apparatus 1 comprises m data driver blocks D1 to Dm. The data driver blocks D1 to Dm are disposed in the TFT circuit arrangement region 12. The data driver blocks D1 to Dm each include a 1:6 demultiplexer. The data driver block D1 distributes a data signal to the data lines DL1 to DL6. The data driver block Dm distributes a data signal to the data lines DL6m−5 to DL6m. In the following description, when describing functions and operations common to the data driver blocks D1 to Dm, the data driver blocks D1 to Dm are collectively referred to as the data driver block Dm.

The display apparatus 1 comprises the driver IC 14 that controls the scan driver blocks S1 to Sn and the data driver blocks D1 to Dm. A control signal output from the driver IC 14 is delivered to the scan driver blocks S1 to Sn and the data driver blocks D1 to Dm via wirings included in a connection wiring portion 15.

As illustrated in FIG. 3, a pixel 111 is formed in a region surrounded by two data lines and two scan lines. One data line and one scan line are connected to each pixel 111. The plurality of pixels 111 are disposed on a matrix. The largest number of pixels 111 disposed in a row direction is 6m (m is an integer of 2 or more). The largest number of pixels 111 disposed in a column direction is n (n is an integer of 2 or more). The first direction is the row direction. The second direction is the column direction. The display apparatus 1 comprises the plurality of pixels arrayed along the first and second directions in a non-rectangular display region Q.

The display apparatus 1 comprises a scan circuit that outputs a scan signal via the scan line to a first pixel group extending in the first direction. An example of the first pixel group is the plurality of pixels 111 disposed in the row direction. An example of the scan circuit is the scan driver blocks S1 to Sn. The display apparatus 1 comprises a data signal circuit that outputs a data signal corresponding to an emission luminance of a pixel to which the scan signal is input via a data line to a second pixel group extending in the second direction. An example of the second pixel group is the plurality of pixels 111 disposed in the column direction. An example of the data signal circuit is the data driver blocks D1 to Dm.

FIG. 4 is a circuit diagram illustrating an example of a pixel circuit included in the pixel 111. The pixel circuit includes an OLED, a driving transistor Tr1, a switching transistor Tr2, and a retention capacitor C. An output voltage of a positive voltage source VDD, an output voltage of a negative voltage source VSS, a video signal Vdata, and a scan signal Scan are input to the pixel circuit. The video signal Vdata is output from each of the data driver blocks D1 to Dm to a corresponding pixel circuit. The scan signal Scan is output from each of the scan driver blocks S1 to Sn to a corresponding pixel circuit. The video signal Vdata is input to a source electrode of the switching transistor Tr2. The scan signal Scan is input to a gate electrode of the switching transistor Tr2. The positive voltage source VDD is connected to a first electrode of the retention capacitor C and the source electrode of the driving transistor Tr1. The negative voltage source VSS is connected to a cathode electrode of the OLED. The drain electrode of the switching transistor Tr2 is connected to a second electrode of the retention capacitor C and the gate electrode of the driving transistor Tr1. The drain electrode of the driving transistor Tr1 is connected to an anode electrode of the OLED.

Voltages corresponding to the scan signal Scan and the video signal Vdata are applied to each pixel circuit. When the scan line is selected by any one of the scan driver blocks S1 to Sn (that is, when the scan signal Scan is turned ON), the switching transistor Tr2 is turned ON and a voltage corresponding to the video signal Vdata is output from the drain electrode of the switching transistor Tr2.

The driving transistor Tr1 supplies to the OLED a current corresponding to a potential difference Vgs between the output voltage of the drain electrode of the switching transistor Tr2 and the output voltage of the positive voltage source VDD. As a result, the OLED emits light with a luminance proportional to the current. After the scan signal Scan is turned OFF, the potential difference Vgs of the driving transistor Tr1 is maintained by charges stored in the retention capacitor C and the OLED continues emitting light.

Since the data driver block Dm includes a 1:6 demultiplexer, one data driver block Dm is disposed for six data lines. Moreover, one scan driver block Sn is disposed for one scan line. Hereinafter, technical means for narrowing a bezel width will be described in detail with reference to FIG. 5A to FIG. 7. To narrow a bezel width will be described as a reduction in bezel width.

FIG. 5A is a block diagram illustrating a configuration example of the data driver block Dm. The data driver block Dm has three regions. The three regions are a DEMUX circuit region B11, a DEMUX wiring region B12, and a scan driver wiring region B13. The circuit of the demultiplexer is formed in the DEMUX circuit region B11. The DEMUX wiring region B12 is a region in which control signal wirings of the data driver block Dm are disposed. The scan driver wiring region B13 is a region in which control signal wirings of the scan driver block Sn are disposed. The wirings disposed in the scan driver wiring region B13 are the wirings of a control signal of the scan driver block Sn and a voltage source. These signals do not affect the operation of the DEMUX.

FIG. 5B is a block diagram illustrating a configuration example of the scan driver block Sn. The scan driver block Sn includes three regions. The three regions are a scan driver region B21, a DEMUX wiring region B22, and a scan driver wiring region B23. The circuit of the scan driver block is formed in the scan driver region B21. The DEMUX wiring region B22 is a region in which control signal wirings of the demultiplexer are disposed. The wirings in this region are control signal wirings of the data driver block Dm. The scan driver wiring region B23 is a region in which control signal wirings of the scan driver block Sn are disposed.

Even when the data driver block Dm is disposed adjacent to the scan driver block Sn, it is not necessary to dispose the control signal wirings of the data driver block Dm in a region outside the scan driver block Sn. This is because the DEMUX wiring region B22 of the scan driver block Sn may be used. Similarly, even when the scan driver block Sn is disposed adjacent to the data driver block Dm, it is not necessary to dispose the control signal wirings of the scan driver block Sn in a region outside the data driver block Dm. This is because the scan driver wiring region B13 of the data driver block Dm may be used.

Next, a configuration example of the scan driver block Sn and the data driver block Dm will be described. FIG. 6A is a plan view illustrating a configuration example of the data driver block Dm. The data driver block Dm has such a configuration as illustrated in FIG. 5A. A 1:6 demultiplexer is formed in the DEMUX circuit region B11 of the data driver block Dm. The demultiplexer has output wirings X1 to X6. Although the demultiplexer includes a plurality of TFTs, one of the plurality of TFTs is illustrated as TFT tf1, for example. An input wiring IN is connected to the driver IC 14 (see FIG. 2), for example, and the driver IC 14 outputs a data signal to the input wiring IN. The data signal is a signal corresponding to an emission luminance of a pixel to which a scan signal is input. The input wiring IN crosses the DEMUX wiring region B12 and the scan driver wiring region B13. The wirings of the control signal (select signal) of the demultiplexer are disposed in the DEMUX wiring region B12. Control signal wirings T1 to T6 corresponding to the output wirings X1 to X6 are disposed in the DEMUX wiring region B12, respectively. The control signal wirings T1 to T6 are connected to the gates of the corresponding TFTs. The DEMUX wiring region B12 includes auxiliary wirings HT1 to HT6 connecting the control signal wirings T1 to T6 to the gates of the corresponding TFTs. The auxiliary wirings HT1 to HT6 are disposed in a direction approximately orthogonal to an extension direction of the control signal wirings T1 to T6. A direction dr1 of a current flowing through a channel layer of the TFT tf1 is approximately parallel to the extension direction of the control signal wirings T1 to T6. The wirings of VDD, VSS, Yn, CLK1, and CLK2 to be described later are disposed in the scan driver wiring region B13. The scan driver wiring region B13 has no wrings electrically connected to the demultiplexer.

FIG. 6B is a plan view illustrating a configuration example of the scan driver block Sn. The scan driver block Sn has such a configuration as illustrated in FIG. 5B. A shift register and the like included in the scan driver block is formed in the scan driver region B21. The scan driver block includes a switching transistor. An output wiring OUT that outputs a scan signal to the scan line is provided in the scan driver region B21. The output wiring OUT is connected to the scan line. Control signal wirings including power supply lines, signal lines, and the like of the scan driver block are disposed in the scan driver wiring region B23. VDD and VSS are voltage sources. Yn is an input signal. CLK1 and CLK2 are clock signals. Auxiliary wirings HVDD, HVSS, HYn, HCLK1, and HCLK2 that connects the control signal wirings and the scan driver block are disposed in the scan driver wiring region B23. For example, the auxiliary wirings HYn, HCLK1 and HCLK2 are connected to the gates of the corresponding TFTs. These auxiliary wirings HVDD, HVSS, HYn, HCLK1 and HCLK2 are disposed in a direction approximately orthogonal to the extension direction of the control signal wiring. The scan driver block Sn includes a plurality of TFTs, and one of the plurality of TFTs is illustrated as TFT tf2, for example. A direction dr2 of a current flowing through a channel layer of the TFT tf2 is approximately parallel to the extension direction of the control signal wirings for VDD, VSS and the like. The control signal wirings T1 to T6 are disposed in the DEMUX wiring region B22. The DEMUX wiring region B22 has no wirings electrically connected to the scan driver block.

In the data driver block Dm, the arrangement of the DEMUX wiring region B12 and the scan driver wiring region B13 may be reversed. In this case, in the scan driver block Sn, the arrangement of the DEMUX wiring region B22 and the scan driver wiring region B23 may be reversed.

FIG. 7 is a plan view illustrating an arrangement example of the data driver block and the scan driver block. FIG. 7 illustrates two data driver blocks Dj and Dj+1 and one scan driver block Si. The data driver blocks Dj and Dj+1 and the scan driver block Si are disposed outside the display region. The distances from the data driver blocks Dj and Dj+1 and the scan driver block Si to an outer circumference line LN of a display region Q are defined as DDj, DDj+1, and DSi, respectively. DDj, DDj+1, and DSi are approximately the same values. That is, the data driver blocks Dj and Dj+1 and the scan driver block Si are disposed at an equal or approximately equal distance from the display region Q. The DEMUX circuit regions B11 of the data driver blocks Dj and Dj+1 are disposed in a first region A1 located outside the display region. The DEMUX wiring regions B12 and the scan driver wiring regions B13 of the data driver blocks Dj and Dj+1 are disposed in a second region A2 located outside the first region A1. The scan driver region B21 of the scan driver block Si is disposed in the first region A1 located outside the display region. The DEMUX wiring region B22 and the scan driver wiring region B23 of the scan driver block Si are disposed in the second region A2 located outside the first region A1.

The above description is summarized as follows. The display apparatus 1 comprises a first wiring portion to which a first signal for controlling the scan circuit is supplied. An example of the first wiring portion includes control signal wirings for VDD, VSS and the like of the scan driver block Sn. The display apparatus 1 comprises a second wiring portion to which a second signal for controlling the data signal circuit is supplied. An example of the second wiring portion includes the control signal wirings T1 to T6 of the data driver block Dm. The display apparatus 1 comprises a first auxiliary wiring portion that connects the first wiring portion and the scan circuit to each other. An example of the first auxiliary wiring portion includes the auxiliary wirings HVDD, HVSS, HYn, HCLK1, and HCLK2. The display apparatus 1 comprises a second auxiliary wiring portion that connects the second wiring portion and the data signal circuit to each other. An example of the second auxiliary wiring portion includes the auxiliary wirings HT1 to HT6.

The control signal wirings for Yn, CLK1, CLK2 and the like of the scan driver block Sn, which are examples of the first wiring portion, are disposed along the outer circumference of the display region. The control signal wirings T1 to T6 of the data driver block Dm, which are examples of the second wiring portion, are disposed along the outer circumference of the display region.

The control signal wirings for Yn, CLK1, CLK2 and the like of the scan driver block Sn, which are examples of the first wiring portion, are disposed in a region away from the display region. In contrast, the control signal wirings T1 to T6 of the data driver block Dm, which are examples of the second wiring portion, are disposed in a region close to the display region. The arrangement of the first and second wiring portions may be reversed. The first wiring portion is disposed in a region close to the display region and the second wiring portion is disposed in a region away from the display region.

In a region near the outer circumference of the display region of the display apparatus 1, a line that connects a corner of a first pixel on the outer side disposed in a stepwise fashion and a corner of a second pixel on the outer side disposed in the stepwise fashion to each other, an extension direction of the first wiring portion, and an extension direction of the second wiring portion are approximately parallel to each other. An example of the corner of the first pixel is a corner CN1 illustrated in FIG. 7. An example of the corner of the second pixel is a corner CN2 illustrated in FIG. 7. An example of the line that connects the corner of the first pixel and the corner of the second pixel to each other is the outer circumference line LN of the display region illustrated in FIG. 7.

Cell illustrated in FIG. 7 is a pixel cell. SL is a scan line. DL is a data line. P is an anti-ESD (Electro-Static Discharge) dummy pattern. Reference numeral 131 indicates the center of print of the glass frit seal portion. As illustrated in FIG. 7, the data driver blocks Dj and Dj+1 are disposed adjacent to one scan driver block Si. Due to the scan driver wiring regions B13 (B23) and the DEMUX wiring regions B12 (B22) included in the three driver blocks, the wirings to the adjacent driver blocks can be disposed orderly. As illustrated in FIG. 7, the anti-ESD dummy pattern P is disposed as a metal layer between an arrangement region of the pixel disposed on an outermost side of the display region Q and an arrangement region of the scan driver block Si. Alternatively, the anti-ESD dummy pattern P may be disposed as a metal layer between the arrangement region of the pixel disposed on the outermost side of the display region Q and an arrangement region of the data driver block Dj or Dj+1.

FIG. 8 is a plan view illustrating an arrangement example of a scan driver block and a data driver block according to the related art. FIG. 8 illustrates one scan driver block SR and two data driver blocks DEMUXs. Although the driver IC 14 that controls one scan driver block SR and two data driver blocks DEMUXs are not illustrated in FIG. 8, the driver IC is disposed on a lower side of FIG. 8 similarly to FIG. 2.

The reason why the data driver block DEMUX is disposed on a side (the lower side) on which the driver IC is disposed will be described. A data line generally extends in a vertical direction (the up-down direction in FIG. 8) in a display region, and the data driver block DEMUX is disposed on one end side of the data line extending in the vertical direction. Moreover, in order to suppress a signal delay due to an extended length of a wiring, the length of a wiring that connects the driver IC and the data driver block DEMUX is preferably set as short as possible. Due to such a reason, the data driver block DEMUX is disposed on the side (the lower side) on which the driver IC is disposed. FIG. 8 illustrates an example in which the data driver block DEMUX and the scan driver block SR are disposed on the lower side.

When the data driver block is disposed on the side (the lower side) on which the driver IC is disposed, the data driver block and the scan driver block are disposed in a concentrated manner, and wirings are also disposed close to each other. When drivers are disposed in such a concentrated manner without taking the arrangement of the drivers into consideration, an area occupied by the drivers increases and the bezel width widens. Therefore, in the present embodiment, a reduction in bezel width is realized by taking the arrangement of drivers into consideration.

Furthermore, when a glass frit is melted by laser irradiation and is then cooled and hardened to seal an OLED, it is necessary to secure a sufficient distance (so-called a margin) between a laser irradiation region and a driver arrangement region. In the example illustrated in FIG. 8, a portion of the data driver block DEMUX surrounded by a circle indicated by symbol "d" is a portion in which the distance to the center of print F of a glass frit seal portion is the smallest. Unless a margin W between this portion and the center of print F is sufficiently large, this portion may be damaged during irradiation of laser to the glass frit. Moreover, a wiring Dout that delivers an output signal of the driver IC to the data driver block DEMUX is located close to the center of print F. Due to this, it is necessary to secure a margin between the wiring Dout and the center of print F. Due to the need to secure this margin, the distance between the center of print F and the display region increases. When this length increases, the bezel width widens.

In contrast to the related art, according to the present embodiment, the scan driver block and the data driver block are arranged optimally (this is referred to as closest packing) so as to realize a reduction in bezel width by taking a circuit arrangement and a wiring arrangement into consideration. In order to realize closest packing, a region in which the scan driver block and the data driver block are disposed is divided into a TFT arrangement region and a wiring region, for example. This wiring region is a common region that includes a wiring group arrangement region of the scan driver block and a wiring group arrangement region of the data driver block in common.

Furthermore, a tangential direction of the outer circumference of the display region and a horizontal direction of the driver block are preferably approximately parallel to each other. Specifically, the tangential direction of the outer circumference of the display region and an extension direction of a wiring disposed in the wiring region are preferably approximately parallel to each other. Furthermore, the tangential direction of the outer circumference of the display region and a direction (see the direction dr1 in FIG. 6A and the direction dr2 in FIG. 6B) in which a current flows in a channel region of a semiconductor disposed in the TFT arrangement region are preferably approximately parallel to each other. Depending on a circuit configuration, the tangential direction of the outer circumference of the display region and a direction orthogonal to the direction in which this current flows may be approximately parallel to each other.

Alternatively, a horizontal direction of the driver block is preferably approximately parallel to a line (for example, LN illustrated in FIG. 7) that connects a corner of a first pixel on the outer side disposed in the stepwise fashion and a corner of a second pixel on the outer side disposed in the stepwise fashion to each other in a region near the outer circumference of the display region. Specifically, the line LN and an extension direction of a wiring disposed in the wiring region are preferably approximately parallel to each other. Furthermore, the line LN and a direction (see the direction dr1 in FIG. 6A and the direction dr2 in FIG. 6B) in which a current flows in the channel region of a semiconductor disposed in the TFT arrangement region are preferably approximately parallel to each other. Depending on a circuit configuration, the line LN and a direction orthogonal to the direction in which this current flows may be approximately parallel to each other.

Furthermore, wirings are disposed in a region close to a printing portion of the glass frit seal portion. Due to such an arrangement of wirings, it is possible to dispose the center of print of the glass frit seal portion closely to the display region to narrow the bezel width while securing a sufficient distance between the TFT arrangement region and the laser irradiation region. When a high melting point metal is used for the wirings, it is possible to further narrow the bezel width since the possibility of breaking of wirings can be suppressed even in a case where laser is irradiated to the wirings.

FIG. 9 illustrates an example of a cross-sectional view of the display section 11. FIG. 9 is a cross-sectional view of a portion of the display section 11 including one OLED element LT, taken along a plane vertical to an image display surface. A transistor T is formed in a left-bottom part of FIG. 9. A retention capacitor C is formed in a right-bottom part of FIG. 9. The OLED element LT is formed on the transistor T and the retention capacitor C. The cross-section illustrated herein represents a layer structure in which the transistor T, the retention capacitor C, and the OLED element LT are formed. The transistor T is a driving transistor Tr1 that drives the OLED element LT, for example.

An underlying insulating film 21 is stacked on a substrate 10. A polysilicon layer 22 is formed on the underlying insulating film 21. A gate insulating film 23 is formed on the polysilicon layer 22. A first metal layer 24 is stacked on the gate insulating film 23. The first metal layer 24 is formed of molybdenum (Mo) or the like. An interlayer insulating film 25 is stacked on the first metal layer 24. A second metal layer 26 is stacked on the interlayer insulating film 25. The second metal layer 26 is formed of a high melting point metal such as molybdenum (Mo) or the like. A portion of the second metal layer 26 is physically and electrically connected to the polysilicon layer 22 via a contact hole. A passivation film 27 is formed on the second metal layer 26. The passivation film 27 is an inorganic insulating film. A planarization film 28 is stacked on the passivation film 27.

An anode electrode 32, an OLED device 33, a cathode electrode 34, and a cap layer 35 are stacked on the planarization film 28. The anode electrode 32 is connected to a TFT circuit output connection portion S1. The TFT circuit output connection portion S1 is connected to the drain of the transistor T. An element separation film 31 is formed between a portion of each of the planarization film 28 and the anode electrode 32 and a portion of each of the OLED device 33 and the cathode electrode 34. The element separation film 31 is an organic film. The element separation film 31 is an insulating layer having a rectangular hole. The element separation film 31 covers edges of the TFT circuit output connection portion S1 and the anode electrode 32 but does not cover a central portion of the anode electrode 32.

A sealing glass 42 is disposed above the cap layer 35 with an air gap 41 interposed therebetween. A quarter wavelength retardation plate 43 and a polarization plate 44 are disposed on the sealing glass 42.

The OLED element LT includes a portion of the anode electrode 32, which is not covered by the element separation film 31, and the OLED device 33, the cathode electrode 34, and the cap layer 35 which are stacked on the upper side thereof.

The upper sides of the central portion of the anode electrode 32 and an edge of the hole formed in the element separation film 31 are covered by the OLED device 33. The OLED device 33 is a layer of an organic composition that emits light of any one of first, second, and third colors when a voltage is applied thereto.

The display apparatus 1 comprises a plurality of pixels. A pixel includes a light emitting device that includes an organic light emitting layer and a pixel circuit that includes a driving transistor that causes a current corresponding to a luminance to flow into the light emitting device. An example of the light emitting device is the OLED element LT. An example of the driving transistor is the driving transistor Tr1.

The cathode electrode 34 is provided on the upper side of the OLED device 33. The cathode electrode 34 is a transparent electrode that continuously covers the OLED elements LTs included in the display section 11. That is, the cathode electrode 34 is an electrode which is provided commonly for adjacent OLED elements LTs.

The cap layer 35 is provided on the upper side of the cathode electrode 34. The cap layer 35 is a layer that continuously covers the OLED elements LTs similarly to the cathode electrode 34. The cap layer 35 is a layer formed of a transparent material having a high refractive index.

Dry air is sealed in the air gap 41. The cap layer 35, the air gap 41, and the sealing glass 42 function as a protection layer that prevent the cathode electrode 34 of the OLED device 33 from deteriorating due to moisture and from being broken by external force.

The driving transistor Tr1 of the pixel circuit allows a current to flow into the light emitting device disposed right above the pixel circuit.

The display section 11 illustrated in FIG. 9 has a two-layer metal structure including two metal layers. In the two-layer metal structure illustrated in FIG. 9, the scan line SL is formed of the first metal layer 24. The data line DL is formed of the second metal layer 26. Moreover, the first wiring portion and the second wiring portion are formed in a wiring layer of which a wiring connected to at least one of a source and a drain of the driving transistor is formed. An example of the wiring layer is the second metal layer 26. Also, the first auxiliary wiring portion and the second auxiliary wiring portion are formed in a layer of which a metal electrode of the capacitor is formed. An example of the layer of which the metal electrode of the capacitor is formed is the first metal layer 24.

In the two-layer metal structure illustrated in FIG. 9, the retention capacitor C has the same structure as the transistor T. The retention capacitor C is a so-called metal oxide semiconductor (MOS) capacitor. An upper electrode of the retention capacitor C and the gate electrode of the transistor T are formed of the same first metal layer 24. A lower electrode of the retention capacitor C and the channel layer of the transistor T are formed of the same polysilicon layer 22. The polysilicon layer 22 that forms the lower electrode of the retention capacitor C is an impurity-doped layer.

In the two-layer metal structure illustrated in FIG. 9, it is necessary to add impurities to the polysilicon layer 22 before forming the first metal layer 24 after forming the polysilicon layer 22. When a process of adding impurities is performed after forming the first metal layer 24, impurities are not added to a portion of the polysilicon layer 22 covered by the first metal layer 24. The portion of the polysilicon layer 22 to which impurities are not added forms an intrinsic semiconductor. The intrinsic semiconductor has a high resistance. Due to this, the retention capacitor C does not function.

The gate insulating film 23 has a predetermined thickness or larger. This is because, when the gate insulating film 23 is thin, the gate electrode and the channel layer are electrically connected and the transistor T does not function.

The present embodiment provides the following advantages. Since a wiring region for the scan driver block Sn and a wiring region for the data driver block Dm are provided in the data driver block Dm and the scan driver block Sn, it is possible to dispose the data driver block Dm and the scan driver block Sn even in a case where a wiring region is not secure in the TFT circuit arrangement region 12. Due to this, it is possible to decrease the width of the TFT circuit arrangement region 12. As a result, it is possible to narrow the bezel width of the display apparatus 1. Since the wiring region is small, it is possible to provide the anti-ESD dummy pattern. When the data driver block Dm and the scan driver block Sn are disposed in the TFT circuit arrangement region 12, the demultiplexer and the shift register are disposed on the inner side. Therefore, wirings are disposed in a region close to the printing portion of the glass frit seal portion, and the demultiplexer and the shift register are not disposed in the region. As a result, it is possible to prevent the demultiplexer and the shift register from being broken when laser is irradiated. Furthermore, when the wirings are formed of the high melting point metal, breaking of the wirings can be prevented even in a case where laser is irradiated to the wirings.

Embodiment 2

In Embodiment 2, the display section 11 is formed in a three-layer metal structure. The three-layer metal structure is a structure including three metal layers. FIG. 10 illustrates an example of a cross-sectional view of the display section 11. The same constituent elements as those of Embodiment 1 will be denoted by the same reference numerals and the description thereof will be omitted.

In the present embodiment, the interlayer insulating film 25 formed on the first metal layer 24 includes two layers including a first interlayer insulating film 251 and a second interlayer insulating film 252. A third metal layer 29 is formed between the first interlayer insulating film 251 and the second interlayer insulating film 252. The third metal layer 29 is formed of molybdenum (Mo) or the like. A portion of the third metal layer 29 forms the upper electrode that faces the lower electrode of the retention capacitor C.

In the present embodiment, the scan line SL1 is formed of the first metal layer 24. The data lines DL1 to DL6m are formed of the second metal layer 26. Moreover, in the three-layer metal structure, the first wiring portion and the second wiring portion are formed in a wiring layer of which a wiring connected to at least one of a source and a drain of the driving transistor is formed. An example of the wiring layer is the second metal layer 26. The first auxiliary wiring portion and the second auxiliary wiring portion are formed in a layer of which a first metal electrode of the capacitor is formed or in a layer of which a second metal electrode of the capacitor is formed. An example of the layer of which the first metal electrode of the capacitor is formed is the first metal layer 24. An example of the layer of which the second metal electrode of the capacitor is formed is the third metal layer 29.

The present embodiment provides the following advantages in addition to the advantages provided by Embodiment 1. The retention capacitor C includes the first metal layer 24, the third metal layer 29, and the first interlayer insulating film 251. In order to allow the driving transistor Tr1 to function properly, the interlayer insulating film 25 needs to have a predetermined thickness or larger. In the present embodiment, the interlayer insulating film 25 includes the first interlayer insulating film 251 and the second interlayer insulating film 252. Due to this, by increasing the thickness of the second interlayer insulating film 252, it is possible to decrease the thickness of the first interlayer insulating film 251. The retention capacitor C may endure the voltage applied as a data signal. Due to this, the first interlayer insulating film 251 can have a minimum necessary thickness. As a result, it is possible to increase the capacitance per unit area of the retention capacitor C. As a result, it is possible to decrease an area necessary for forming the retention capacitor C. Therefore, an area necessary for forming the pixel circuit decreases. Therefore, it is possible to increase a resolution of the display section 11.

Since the number of metal layers is increased from two layers to three layers, the number of layers in which wirings are disposed increases. Therefore, more complex circuits than two layers can be created in the same area as two layers.

The data line DL is formed of the second metal layer 26. This is because, when the source and the drain of the switching transistor Tr2 are formed of the second metal layer 26, the data lines DL connected to the source and the drain are formed of the same metal layer. As a result, it is easy to design wirings. Moreover, since the data lines DL are the same layer, it is possible to shorten the wirings to the switching transistor Tr2 and to reduce a data delay.

Embodiment 3

In the present embodiment, a display apparatus in which a driver block has a longitudinal shape to pack the driver block more closely will be described. In the case of the closest packing, the data driver block and the scan driver block have a longitudinal shape, for example. In other words, the data driver block and the scan driver block have such a shape that is short in a circumferential direction and is long in a direction vertical to the circumferential direction. The driver block has such a longitudinal shape so that a larger number of driver blocks can be disposed along the circumferential direction.

FIG. 11 is a plan view illustrating a configuration example of a data driver block according to Embodiment 3. In FIG. 11, the same constituent elements as those of Embodiment 1 will be denoted by the same reference numerals and the description thereof will be omitted. A data driver block Dsm illustrated in FIG. 11 includes four regions. The four regions are a DEMUX circuit region B11, a first DEMUX wiring region B121, a second DEMUX wiring region B122, and a scan driver wiring region B13. In the data driver block Dsm, the arrangement of TFTs included in the DEMUX circuit region B11 is changed. Due to this, a pitch of the output wirings X1 to X6 included in the DEMUX circuit region B11 decreases. Moreover, the DEMUX wiring region is divided into two regions including the first DEMUX wiring region B121 and the second DEMUX wiring region B122. The data driver block Dsm of the present embodiment has a more longitudinal shape than that of the data driver block Dm of Embodiment 1. Although not illustrated in the drawing, the scan driver block has a longitudinal shape similarly to the data driver block Dsm. In the following description, the scan driver block having a longitudinal shape is denoted by Ssn.

FIG. 12 is a plan view illustrating an arrangement example of the data driver block and the scan driver block. FIG. 13 is a partial enlarged view of FIG. 12. Although a sufficient space for the wiring regions is present in a portion close to the driver IC 14, the data driver blocks are disposed in a concentrated manner. Therefore, the longitudinal data driver blocks Dsm capable of reducing a driver output wiring pitch are disposed. The longitudinal scan driver blocks Ssn are disposed also regarding the scan driver block. In the other region, the data driver blocks and the scan driver blocks are disposed obliquely so as to follow an outer edge of the display section 11.

As illustrated in FIG. 13, the first region A1 is divided into two regions. A region disposed on a side of the connection wiring portion 15 is a third region A3. A region other than the third region A3 is a fourth region A4. In this case, the longitudinal data driver blocks Dsm are disposed in the third region. The same data driver blocks Dm as Embodiment 1 are disposed in the fourth region A4. The data driver block Dsm has a narrower (smaller) width than the data driver block Dm. Similarly, the longitudinal scan driver blocks Ssn are disposed in the third region A3. The same scan driver blocks Sn as Embodiment 1 are disposed in the fourth region A4. The scan driver block Ssn has a narrower (smaller) width than the scan driver block Sn.

The data line is disposed along the second direction and includes on one end side of the data line the connection wiring portion connected to a control circuit that controls the scan circuit and the data signal circuit, the first region includes a third region disposed on a side of the connection wiring portion and a fourth region different from the third region, and a width of the scan circuit disposed in the third region is smaller than a width of the scan circuit disposed in the fourth region. An example of the control circuit is the driver IC 14. An example of the connection wiring portion is the connection wiring portion 15. An example of the first to fourth regions is the first to fourth regions A1 to A4.

Due to the above-described configuration, it is possible to provide a relatively large margin to an arrangement pitch of the data driver blocks Dm. That is, the number of outputs of a circuit block used for a pixel pitch increases. Due to this, the same data driver block Dm and the same scan driver block Sn as Embodiment 1 are disposed in order to reduce the wiring width.

The present embodiment provides the following advantages in addition to the advantages provided by Embodiment 1. The longitudinal data driver blocks Dsm and the longitudinal scan driver blocks Ssn are disposed near the driver IC in which the data driver blocks are disposed in a concentrated manner, and it is therefore easy to design wirings since it is possible to decrease the driver output wiring pitch.

Embodiment 4

The present embodiment relates to a configuration in which a further reduction in bezel width than Embodiment 3 is realized. FIG. 14 is a plan view illustrating a configuration of the display apparatus 1. Wirings that connect the driver IC and the driver blocks are disposed close to each other on the lower side (the driver IC connection side) of the display section 11. However, it is not optimal to reduce the distance between the wirings to reduce the wiring region, for example. This is because, when the distance between the wirings is reduced, the possibility of increasing a parasitic capacitance between the wirings may increase.

Particularly, the left and right wiring regions Ar are the largest. The left and right wiring regions Ar become a bottleneck to make it difficult to narrow the bezel width.

Therefore, a light emitting area La of a pixel is moved further downward in the screen than an arrangement area Ca of the pixel circuits. By doing so, it is possible to reduce a substantial bezel width (a distance from a module outline portion to a display region). The moving distance is approximately one pixel, for example. The present embodiment is preferably applied to a so-called top-emission OLED.

FIG. 15 is a plan view illustrating a configuration example of a pixel circuit. The pixel circuit illustrated in FIG. 15 has a two-layer metal structure similarly to FIG. 9. A region Cell surrounded by a narrow dot line indicates a pixel circuit cell frame. FIG. 15 illustrates an example of an RGB stripe arrangement. Three pixel circuits are formed in one pixel. A region An surrounded by a solid line indicates an outer edge of an anode electrode. A dot line RL in the anode electrode An indicates a red light emitting region. A dot line GL indicates a green light emitting region. A dot line BL indicates a blue light emitting region. The pixel circuit illustrated in FIG. 15 includes a reset transistor to be described with reference to FIG. 20.

In FIG. 15, the configuration of a pixel circuit will be described by way of an example of a blue subpixel illustrated on the right side. The constituent elements of the pixel circuit are disposed in the following order from the upper side of the drawing sheet. A retention capacitor C is formed. A first electrode of the retention capacitor C is connected to a power supply line OVDD(B) on the right side. A second electrode of the retention capacitor C and a gate of a driving transistor M2 to be described later share the same metal layer.

The driving transistor M2 is disposed on the lower side in the drawing sheet of the retention capacitor C. A contact hole 1C is disposed between the retention capacitor C and the driving transistor M2. The drain of the driving transistor M2 and the source or the drain of the reset transistor M3 are electrically connected via the contact hole 1C.

The reset transistor M3 for negative voltage application is disposed on the lower side in the drawing sheet of the driving transistor M2. The reset transistor M3 is turned on and off by a reset line Rst. Furthermore, a switching transistor M1 is disposed on the upper side in the drawing sheet of the retention capacitor C. The switching transistor M1 is turned on and off via the scan line SL. A contact hole 2C is provided between the reset line Rst and the scan line SL. The drain of the driving transistor M2 and the anode electrode (see FIG. 15) of the OLED are electrically connected via the contact hole 2C. This anode electrode is an anode electrode of the OLED element disposed on the lower side in the drawing sheet of a pixel circuit disposed in the region Cell.

As described above, the pixel circuit (disposed in the region Cell) disposed on the upper side of the reset line Rst on the drawing sheet of FIG. 15 controls emission of the OLED element disposed on the lower side of the reset line Rst. That is, a light emitting device of the OLED element is disposed to be shifted toward the lower side approximately by one pixel in relation to the pixel circuit cell frame.

FIG. 16 to FIG. 19 are plan views illustrating a pattern example of a layer. FIG. 16 illustrates a pattern of the polysilicon layer 22. Moreover, the polysilicon layer 22 includes channels of the switching transistor M1, the driving transistor M2, and the reset transistor M3.

FIG. 17 illustrates a state in which the pattern of the first metal layer 24 is stacked on the polysilicon layer 22. The first metal layer 24 includes the scan line SL and the reset line Rst. The first metal layer 24 includes the upper electrode of the retention capacitor C. The first metal layer 24 includes the gates of the switching transistor M1, the driving transistor M2, and the reset transistor M3. The first metal layer 24 includes the second electrode of the retention capacitor C.

FIG. 18 illustrates the pattern of the second metal layer 26. The second metal layer 26 includes data lines Vdata(R), Vdata(G), and Vdata(B). The second metal layer 26 includes power supply lines OVDD(R), OVDD(G), and OVDD(B). The second metal layer 26 includes the sources and the drains of the switching transistor M1, the driving transistor M2, and the reset transistor M3.

FIG. 19 is a plan view illustrating a positional relation between a light emitting region and a pixel circuit cell frame. In FIG. 19, the light emitting region L and the pixel circuit cell frame overlap each other. However, the pixel circuit right below the light emitting region L drives an OLED element corresponding to a light emitting region L which is shifted downward by one pixel.

In the display apparatus 1 of the present embodiment, the data line is disposed along the second direction and includes on one end side of the data line the connection wiring portion connected to the control circuit that controls the scan circuit and the data signal circuit, and the driving transistor of the pixel circuit allows a current to flow into the light emitting device disposed at a position shifted by one pixel toward the one end side of the data line in relation to the light emitting device disposed right above the pixel circuit.

The present embodiment provides the following advantages in addition to the advantages provided by Embodiment 1. The positional relation between the light emitting region and the pixel circuit is shifted, and it is therefore possible to further reduce the bezel width of the display apparatus.

The pixel circuit is not limited to the circuit illustrated in FIG. 4. FIG. 20 is a circuit diagram illustrating another example of a pixel circuit included in a pixel 111. The pixel circuit includes an OLED, a driving transistor Tr1, a switching transistor Tr2, a reset transistor Tr3, and a retention capacitor C. An output voltage of a positive voltage source VDD, an output voltage of a negative voltage source VSS, a video signal Vdata, a scan signal 1 Scan(N), a scan signal 2 Scan(N−1), and a reset signal Vre are input to the pixel circuit. The video signal Vdata is output from the data driver blocks D1 to Dm to the corresponding pixel circuits. The scan signal 1 Scan(N) is output from an N-th scan driver block SN. The scan signal 2 Scan(N−1) is output from a (N−1)-th scan driver block SN−1.

The video signal Vdata is input to the source electrode of the switching transistor Tr2. The reset signal Vre is input to the source electrode of the reset transistor Tr3.

The scan signal 1 Scan(N) is input to the gate electrode of the switching transistor Tr2. The scan signal 2 Scan(N−1) is input to the gate electrode of the reset transistor Tr3. The positive voltage source VDD is connected to the first electrode of the retention capacitor C and the source electrode of the driving transistor Tr1. The negative voltage source VSS is connected to the cathode electrode of the OLED.

The drain electrode of the switching transistor Tr2 is connected to the second electrode of the retention capacitor C and the gate electrode of the driving transistor Tr1. The drain electrode of the driving transistor Tr1 and the drain electrode of the reset transistor Tr3 are connected to the anode electrode of the OLED.

The video signal Vdata is a voltage which corresponds to the emission luminance of the OLEDs and which ranges between a black potential and a white potential. The difference between the pixel circuit in FIG. 4 and the pixel circuit in FIG. 20 lies in the presence of a function of resetting the anode electrode of the OLED using the reset transistor Tr3. The reset transistor Tr3 is used for stopping emission of the OLED by putting the voltage between the anode electrode and the cathode electrode of the OLED to a zero bias state or a reverse state (the voltage of the anode electrode is lower than the voltage of the cathode electrode) rather than by putting the same to a forward state (the voltage of the anode electrode is higher than the voltage of the cathode electrode).

Specifically, the reset transistor Tr3 is turned on by the scan signal 2 Scan(N−1) immediately before the scan signal 1 Scan(N) is turned on. When the reset transistor Tr3 is turned on, the reset signal Vre is applied to the cathode electrode of the OLED. The reset signal Vre has the same potential as the potential of the negative voltage source VSS or a lower potential than the potential of the negative voltage source VSS, for example. As a result, the OLED is in a reverse biased region of a diode and does not emit light.

The emission of the OLED is stopped using the reset transistor, and it is therefore possible to lower the black level. Moreover, it is possible to suppress the crosstalk between subpixels which appear frequently.

According to an aspect of the present disclosure, it is possible to reduce the bezel width of a display apparatus having a non-rectangular display region.

Depending on whether the pixel circuit illustrated in FIG. 4 or the pixel circuit illustrated in FIG. 20 is employed, the configuration of the driver IC 14, the data driver blocks D1 to Dm, and the scan driver blocks S1 to Sn can be changed appropriately. In the pixel circuit illustrated in FIG. 20, two types of scan signals are input to the same pixel circuit (that is, two scan lines are wired in one pixel circuit). Therefore, each of the scan driver blocks S1 to Sn is connected to two scan lines and outputs different signals to the two scan lines. Such a modification is also appropriately possible.

The technical features (constituent elements) described in each embodiment may be combined with one another, and such combinations may form new technical features.

It should be understood that the embodiments disclosed herein are illustrative and not limitative in all aspects. The scope of the present invention is defined not by the foregoing description but by the scope of the claims, and is intended to include meanings equivalent to the scope of the claims and all modifications within the scope.

It is noted that, as used herein and in the appended claims, the singular forms "a", "an", and "the" include plural referents unless the context clearly dictates otherwise.

What is claimed is:

1. A display apparatus, comprising:
a plurality of pixels arrayed in a non-rectangular display region along a first direction and a second direction;
a scan circuit that outputs a scan signal via a scan line to a first pixel group extending along the first direction;
a data signal circuit that outputs a data signal corresponding to an emission luminance of a pixel to which the scan signal is input, via a data line to a second pixel group extending along the second direction;
a first wiring portion to which a first signal to control the scan circuit is supplied;
a second wiring portion to which a second signal to control the data signal circuit is supplied;
a first auxiliary wiring portion that connects the first wiring portion and the scan circuit to each other; and
a second auxiliary wiring portion that connects the second wiring portion and the data signal circuit to each other,
wherein the scan circuit and the data signal circuit are disposed in a first region located outside the display region,
the first wiring portion and the second wiring portion are disposed in a second region located outside the first region,
the first auxiliary wiring portion is disposed along a direction approximately orthogonal to an extension direction of the first wiring portion, and
the second auxiliary wiring portion is disposed along a direction approximately orthogonal to an extension direction of the second wiring portion.

2. The display apparatus according to claim 1, further comprising:
a plurality of the scan circuits; and
a plurality of the data signal circuits,
wherein each of the plurality of data signal circuits is a demultiplexer that sequentially outputs a data signal to a plurality of the data lines in a time-division manner.

3. The display apparatus according to claim 1,
wherein the scan circuit and the data signal circuit are disposed along an outer circumference of the display region and are adjacent to each other.

4. The display apparatus according to claim 2,
wherein the plurality of scan circuits are disposed at an equal or approximately equal distance from a side of an outer circumference of the display region, and
the plurality of data signal circuits are disposed at an equal or approximately equal distance from the side of the outer circumference of the display region.

5. The display apparatus according to claim 2,
wherein each of the plurality of scan circuits includes a thin film transistor, the thin film transistor including a gate to which the first signal is input, and
a direction in which a current flows in a channel region of a semiconductor layer of the thin film transistor is approximately parallel to the extension direction of the first wiring portion.

6. The display apparatus according to claim 2,
wherein each of the plurality of data signal circuits includes a thin film transistor, the thin film transistor including a gate to which the second signal is input, and
a direction in which a current flows in a channel region of a semiconductor layer of the thin film transistor is approximately parallel to the extension direction of the second wiring portion.

7. The display apparatus according to claim 1,
wherein the pixel includes a light emitting device including an organic light emitting layer and a pixel circuit including a capacitor and a driving transistor that allows a current corresponding to a luminance to flow into the light emitting device,
the pixel circuit includes at least a first layer and a second layer, and is formed on a substrate,
the light emitting device is formed on an upper side of the pixel circuit,
the first layer includes the first wiring portion, the second wiring portion and a wiring connected to at least one of a source and a drain of the driving transistor, and
the second layer includes the first auxiliary wiring portion, the second auxiliary wiring portion and a metal electrode of the capacitor.

8. The display apparatus according to claim 7,
wherein the driving transistor of the pixel circuit allows the current to flow into the light emitting device disposed right above the pixel circuit.

9. The display apparatus according to claim 7,
wherein the data line is disposed along the second direction and includes a connection wiring portion on one end side of the data line, the connection wiring portion being connected to a control circuit that controls the scan circuit and the data signal circuit,
the first region includes a third region disposed on a side of the connection wiring portion and a fourth region different from the third region,
the display apparatus further comprises a plurality of the scan circuits, and
a width of the scan circuit disposed in the third region is smaller than a width of the scan circuit disposed in the fourth region.

10. The display apparatus according to claim 7,
wherein the data line is disposed along the second direction and includes a connection wiring portion on one end side of the data line, the connection wiring portion being connected to a control circuit that controls the scan circuit and the data signal circuit, and
the driving transistor of the pixel circuit allows the current to flow into the light emitting device disposed at a position shifted by one pixel toward the one end side of the data line in relation to the light emitting device disposed right above the pixel circuit.

11. The display apparatus according to claim 1,
wherein the pixel includes a light emitting device including an organic light emitting layer and a pixel circuit including a capacitor and a driving transistor that allows a current corresponding to a luminance to flow into the light emitting device,
the pixel circuit includes at least first to third layers, and is formed on a substrate,
the light emitting device is formed on an upper side of the pixel circuit,
the first layer includes the first wiring portion, the second wiring portion and a wiring connected to at least one of a source and a drain of the driving transistor,
the second layer includes a first metal electrode of the capacitor,
the third layer includes a second metal electrode of the capacitor, and
the second layer or the third layer includes the first auxiliary wiring portion and the second auxiliary wiring portion.

12. The display apparatus according to claim 11,
wherein the driving transistor of the pixel circuit allows the current to flow into the light emitting device disposed right above the pixel circuit.

13. The display apparatus according to claim 11,
wherein the data line is disposed along the second direction and includes a connection wiring portion on one end side of the data line, the connection wiring portion being connected to a control circuit that controls the scan circuit and the data signal circuit,
the first region includes a third region disposed on a side of the connection wiring portion and a fourth region different from the third region,
the display apparatus further comprises a plurality of the scan circuits, and
a width of the scan circuit disposed in the third region is smaller than a width of the scan circuit disposed in the fourth region.

14. The display apparatus according to claim 11,
wherein the data line is disposed along the second direction and includes a connection wiring portion on one end side of the data line, the connection wiring portion being connected to a control circuit that controls the scan circuit and the data signal circuit, and
the driving transistor of the pixel circuit allows the current to flow into the light emitting device disposed at a position shifted by one pixel toward the one end side of the data line in relation to the light emitting device disposed right above the pixel circuit.

15. The display apparatus according to claim 1,
wherein a metal layer is disposed between an arrangement region of the pixel disposed on an outermost side of the display region and an arrangement region of the scan circuit or the data signal circuit.

* * * * *